(12) United States Patent
Smith et al.

(10) Patent No.: US 9,810,530 B2
(45) Date of Patent: Nov. 7, 2017

(54) AUTOFOCUS SYSTEM AND METHOD

(71) Applicant: Nikon Corporation, Tokyo (JP)

(72) Inventors: Daniel Gene Smith, Tucson, AZ (US); Eric Peter Goodwin, Tucson, AZ (US)

(73) Assignee: NIKON CORPORATION, Tokyo (JP)

( * ) Notice: Subject to any disclaimer, the term of this patent is extended or adjusted under 35 U.S.C. 154(b) by 55 days.

(21) Appl. No.: 14/593,190

(22) Filed: Jan. 9, 2015

(65) Prior Publication Data

US 2015/0116729 A1    Apr. 30, 2015

Related U.S. Application Data

(63) Continuation of application No. 13/066,741, filed on Apr. 22, 2011, now abandoned.

(60) Provisional application No. 61/343,074, filed on Apr. 23, 2010.

(51) Int. Cl.
G01B 9/02 (2006.01)
G01B 11/25 (2006.01)
G01B 11/06 (2006.01)
G03F 7/20 (2006.01)

(52) U.S. Cl.
CPC .......... *G01B 11/25* (2013.01); *G01B 11/0608* (2013.01); *G03F 7/70641* (2013.01)

(58) Field of Classification Search
CPC . G01B 11/25; G01B 11/2504; G01B 11/0608; G01B 11/0691; G01B 11/2441; G01B 2290/70; G01B 2290/45; G01B 9/02022; G01B 9/02007; G03F 7/70641; G01D 5/38

USPC ........................ 356/488, 494, 512
See application file for complete search history.

(56) References Cited

U.S. PATENT DOCUMENTS

2005/0057757 A1* 3/2005 Colonna De Lega ......... G01B 11/0675 356/497
2009/0262363 A1* 10/2009 Keshavmurthy .. G01B 11/2509 356/511

* cited by examiner

*Primary Examiner* — Tarifur Chowdhury
*Assistant Examiner* — Jonathon Cook
(74) *Attorney, Agent, or Firm* — Yakov S. Sidorin; Quarles & Brady LLP

(57) ABSTRACT

Autofocus system (AF) employing, in addition to specified optical units, fringe projection and fringe detection systems (FPS, FDS) and specifically-configured data processing system. AFS is configured to project with FPS a sinusoidal fringe pattern, formed by a pattern source, on a substrate and to image the so projected pattern from substrate onto optical detector with FDS to form optical image from which topology of the substrate is defined as substrate moves relative to the projected pattern. Pattern source may include diffraction grating oriented that the projected pattern is inclined relative to direction of substrate scanning Topology profile is corrected for tilt of substrate, Goos-Hanchen errors, and for fringe-pattern-induced errors outside a chosen spatial-frequency range. To reduce errors of topology profile, at least five values of phase difference are used. AFS is configured to define temporal phase shifting in optical image without using any moving parts in the AFS.

28 Claims, 20 Drawing Sheets

FIG. 4: Fixed fringes allow a spatial phase shifting technique to be used to calculate the fringe phase and determine the wafer height.

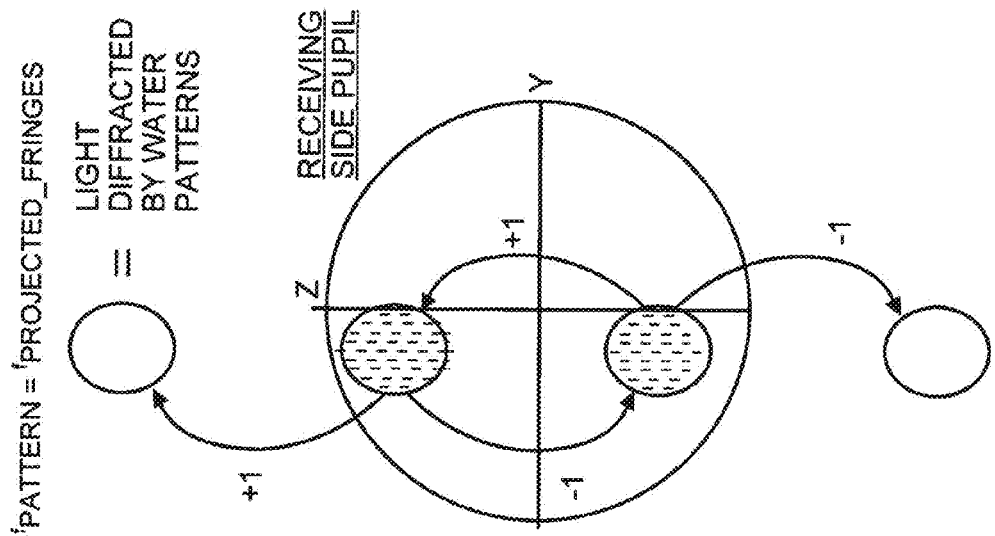
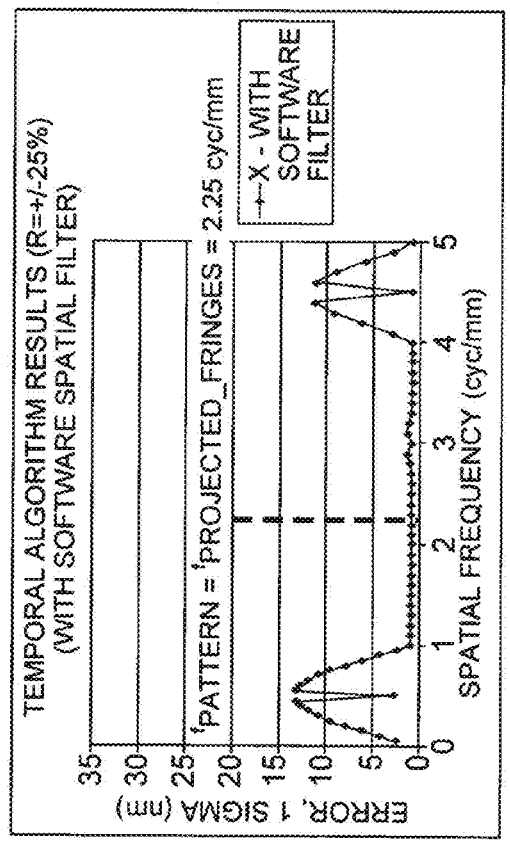
FIG. 16

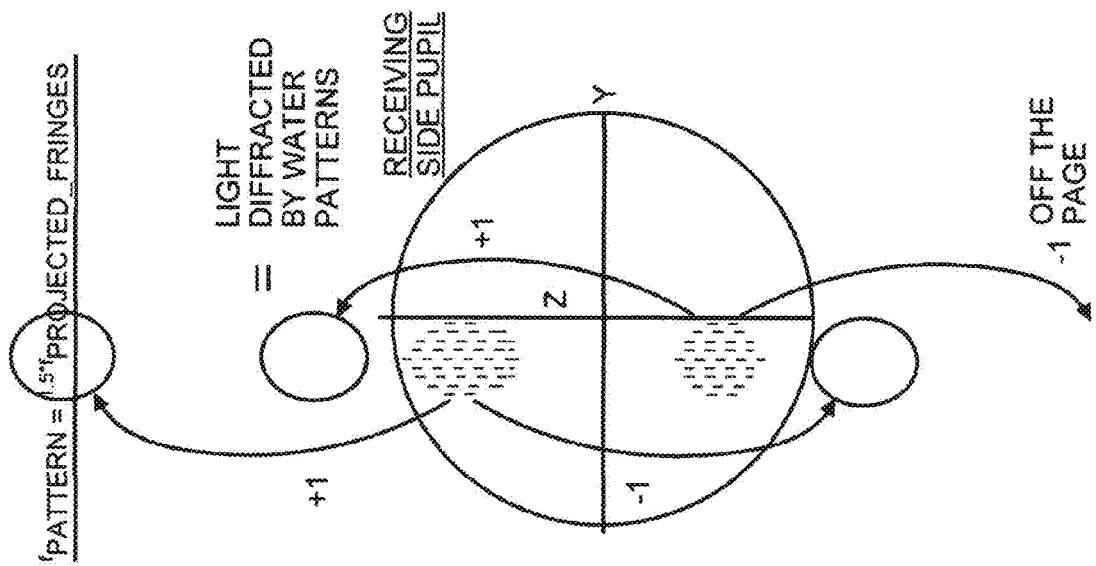
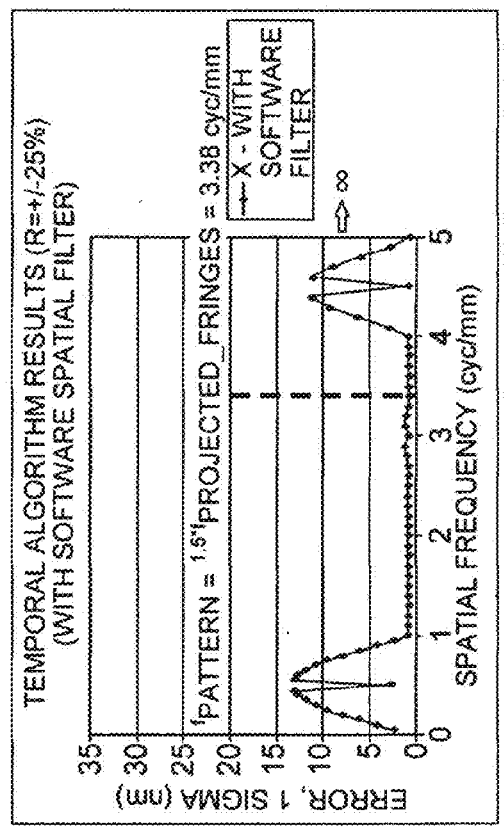
FIG. 17

AUTOFOCUS SYSTEM AND METHOD

CROSS-REFERENCE TO RELATED APPLICATIONS

This application is a continuation from U.S. patent application Ser. No. 13/066,741 filed on Apr. 22, 2011, which in turn claims priority from the U.S. Provisional Patent Application No. 61/343,074, filed on Apr. 23, 2010. The disclosure of each of the above-mentioned patent applications is incorporated by reference herein.

BACKGROUND

The present invention provides new and useful concepts in a surface height measurement system and method, also referred to as an autofocus (AF) system and method that would be used with an optical imaging system and method that images a substrate (e.g. in the production of a semi conductor wafer).

A current, known autofocus system and method involves imaging an array of slits onto the surface under investigation (e.g. a semiconductor wafer) at a grazing angle of incidence. The imaging beams are largely reflected from the substrate and the reflected image of the slit array is relayed to a receiving slit array. The light transmitted through each slit in the receiving array is relayed to a detector element—one for each slit. When the substrate moves up or down, the slit image translates relative to the receiving slit reducing the power on the detector element. To enable sensing of the direction of substrate travel, a vibrating mirror is placed in the pupil of the imaging system (sending side in current AF system). This vibrates the image of the sending slits on the receiving slits and the resulting signal can be decomposed into its first and second harmonics. The ratio of the amplitudes of the first and second harmonics is approximately proportional to the substrate z-position and is known as the "PSD signal".

A basic aspect of the present invention provides a solution that uses largely the same imaging scheme, but uses an alternative to the PSD signal. The present invention has several advantages over the PSD signal in that the present invention does not require a moving element (other than the substrate under investigation), has a larger linear dynamic range, and is inherently less sensitive to patterns that may be present on the substrate.

SUMMARY

The present invention relates to new and useful autofocus system and method concepts, based on use of fringe projection and detection, rather than slit projection and detection. In the autofocus system and method concepts of the present invention, a fringe detection system is configured to detect fringes projected from a substrate that is movable relative to an imaging location. A fringe projection system projects fringes onto the substrate, a fringe relay system relays projected fringes from the substrate to the fringe detection system, and a processing system processes data from the fringe detection system and produces output related to the orientation of the substrate relative to the imaging location.

According to a preferred embodiment, the fringe projection system comprises a grating that is illuminated from a source and produces fringes comprising diffracted light from the grating that are projected onto the substrate. The fringes are in the form of sinusoidal irradiance patterns that are projected onto the substrate. Moreover, the fringe projection system is preferably configured to project only +1 and −1 diffracted order producing a sinusoidal irradiance patterns on the substrate, the relay system is configured such that all projected fringes have the nearly the same spatial frequency, and the processing system uses detected shifts in the projected fringes in producing output related to the orientation of the substrate relative to the imaging location.

In one alternative form of system and method, the fringe projection system is configured to project fringes to a reflector that is separate from the substrate, and fringes from the reflector are projected to the detection system for use by the processing system as a reference pattern in the production of the autofocus information.

In another alternative system and method, the fringe projection system comprises a plurality of non monochromatic sources that produce the fringes that are projected onto the substrate, and the fringe relay system comprises a device for spatially separating fringes that are produced from the monochromatic sources and are projected from the substrate.

The system and method of the present invention, also has various new and useful aspects. In one of those aspects, the fringe relay system comprises a spatial filtering device, and the fringe relay system has a pupil plane through which fringes projected from the substrate are directed to the detection system, and the spatial filtering device is configured to predetermine the light distribution in the pupil plane.

In another new and useful aspect, the fringe detection system comprises an area detector for detecting projected fringes, and the fringe projection system is configured to provide fringe temporal phase shifting in the fringe projection from the substrate that is relayed to the fringe detection system. More specifically, the fringe projection system is configured to provide temporal phases shifting by synchronizing the rate of capture of the projected fringes by the area detector with the movement of the substrate relative to the imaging location, to enable detection of the projected fringes from the same region of the substrate on the area detector as the substrate moves relative to the imaging location.

In yet another new and useful aspect, the system and method of the present invention the fringe projection system and the processing system are configured to correct for Goos Hanchen errors in the projection of fringes from the substrate to the detection system. More specifically, the fringe detection system comprises an area detector, the projection system and the relay system are configured to project and relay fringes at one or more wavelength bands and one or more polarization states to the area detector, and the processing system is configured to process the detected fringes with a set of coefficients designed to enable compensation for Goos Hanchen errors in the projection from the substrate to the fringe detection system.

In still another new and useful aspect, in a system and method according to the principles of the present invention, the processing system is configured to correct for Abbe errors in the projection from the substrate to the detection system. Abbe errors, as used here, generally refer to errors produced by tilted reflecting surfaces (e.g. a tilted substrate in this case). The correction is provided with an algorithm that uses information already contained in the measured fringe phase.

In still another new and useful aspect, in a system and method according to the principles of the present invention, the processing system is configured to spatially filter data from the detection system to remove ghost topography that is above a predetermined spatial frequency.

In still another new and useful aspect, in a system and method according to the principles of the present invention, a delay is produced for one beam in the two beam interference fringes nominally projected to the substrate in an AF system. The delay is made to be longer than the coherence length of the source so that the contrast of the fringes at the substrate is substantially reduced. Then, a compensating delay is inserted into the receiving optics that relays the beams from the substrate to the detector. The compensating delay recovers the fringe contrast, but also destroys the image of the substrate that would be formed without the second delay.

Thus, a basic aspect of the present invention provides a new type of detection system for AF, as an alternative to slit projection and PSD.

One advantage of the autofocus system and method of the present invention is that it removes the need for a vibrating mirror, or any other moving mechanical device that shifts the position of projected pattern. Instead we must simply detect the phase of projected fringes.

In addition the autofocus system and method of the present invention can simplify the imaging system. In fact, this approach does not require especially good imaging in a conventional sense because fringe contrast is determined by the source coherence, and fringe distortion is not a strong factor because it is only changes in the fringe phase that are of concern. So a fringe projection system may be much easier to implement for larger diameter substrates (e.g. with diameters on the order of 450 mm) than a slit projection system which requires better imaging.

Finally, because of the large depth of focus provided by two plane waves, this autofocus system and method of the present invention can be made to have a very large dynamic range—depending on the coherence of the source. This means that the there would be little need for dynamic adjustments of the system, which are needed in a slit projection system.

These and other features of the present invention will become further apparent from the following detailed description and the accompanying drawings and exhibit.

BRIEF DESCRIPTION OF THE DRAWINGS

FIGS. 14-18 are schematic illustrations of spatial filtering concepts, for a system and method according to the principles of the present invention;

Exhibit A has color images of the illustrations of FIGS. 3, 4, and 6-20.

DETAILED DESCRIPTION

Figure 1:
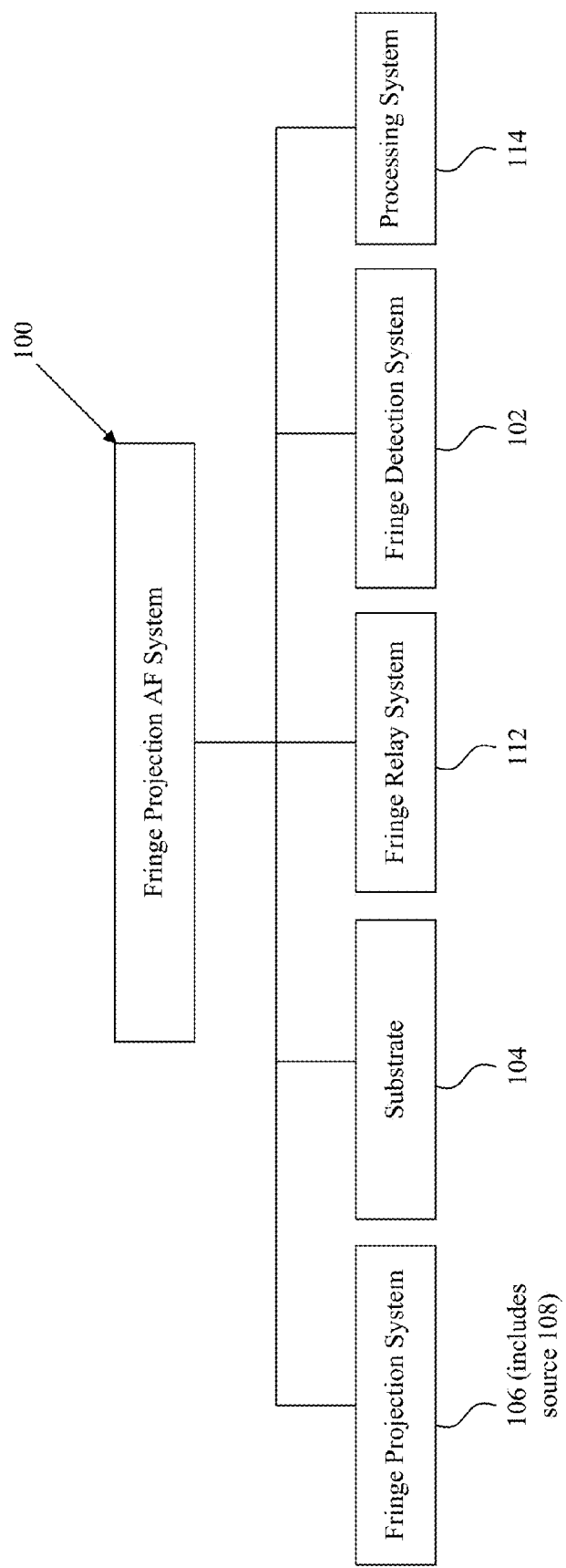
FIG. 1 is a schematic illustration of the system components for an autofocus system and method, according to the principles of the present invention.
Figure 2:
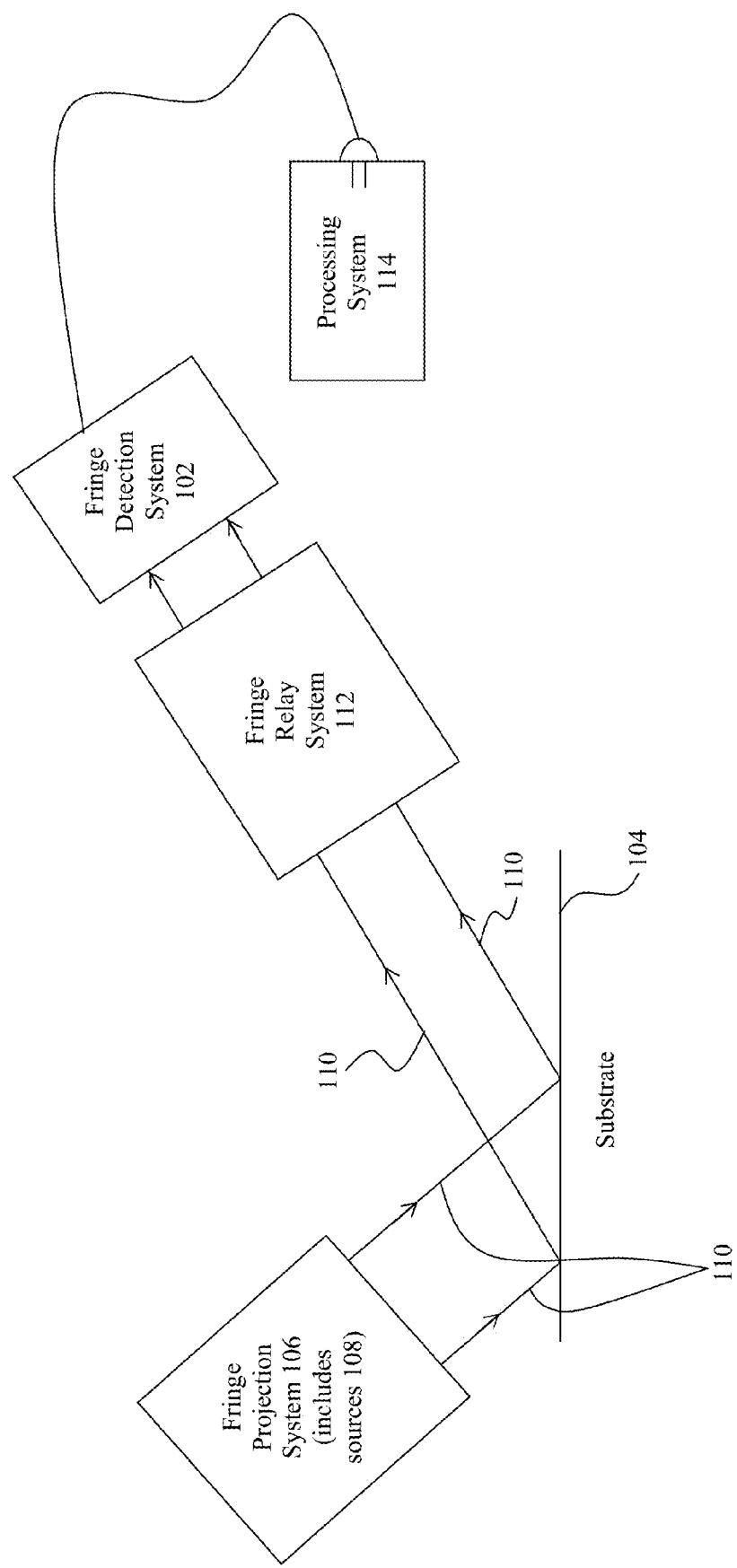
FIG. 2 is a schematic illustration of the manner in which the system components are oriented relative to a substrate, for implementing autofocus concepts in accordance with the principles of the present invention.

As described above, the present invention provides an autofocus system and method that is based on fringe projection FIGS. 1 and 2 illustrate the basic components and configuration of an autofocus (AF) system 100 and method according to the principles of the present inventions As shown in FIGS. 1 and 2, the AF system 100 comprises
1. a fringe detection system 102 configured to detect a fringe projection from a substrate 104 that is movable relative to an imaging location,
2. a fringe projection system 106 that projects fringes onto the substrate 104, the fringe projection system comprising one or more sources 108 and fringes produced by beams (shown by the ray lines 110 in FIG. 2 and in several other figures) that are directed onto and reflected from the substrate 104 for each source,
3. a fringe relay system 112 that relays beams (also shown by ray lines 110) reflected from the substrate 104 to the fringe detection system 102 in a manner such that the beams interfere at the fringe detection system, and
4. a processing system 114 for processing data from the fringe detection system and producing output related to the orientation of the substrate relative to the imaging location.

In a method according to the basic principles of the present invention,
1. fringes are projected from each of the sources 108 onto the substrate 104 that is moveable relative to the imaging location, where the fringes are produced by beams 110 from each of the one or more sources that are directed onto and reflected by the substrate 104,
2. the reflected beams from the substrate are relayed to the fringe detection system 102 in a manner such that the beams interfere at the fringe detection system, and
3. data from the fringe detection system is processed to produce output related to the orientation of the substrate 104 relative to the imaging location.

Figure 3:
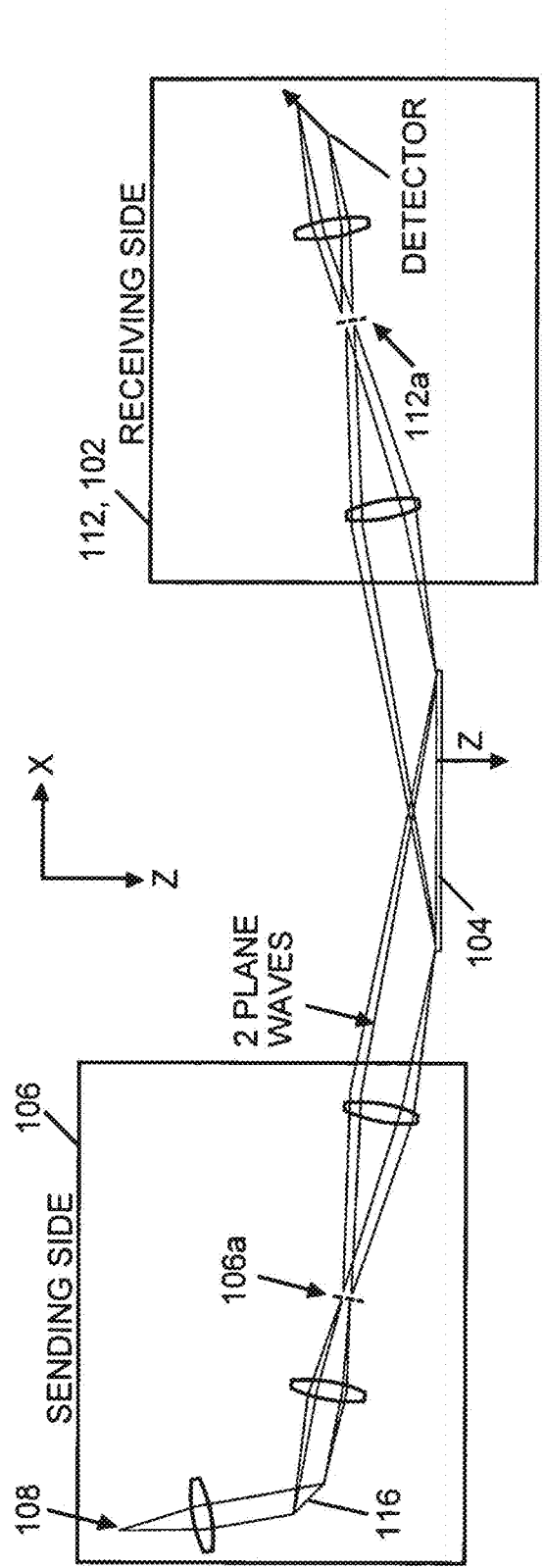
FIGS. 3 and 4 are schematic illustrations of certain optical concepts for a system and method according to the principles of the present invention, particularly with respect to one way fringes are produced, in accordance with a system and method of the present invention.
Figure 4:
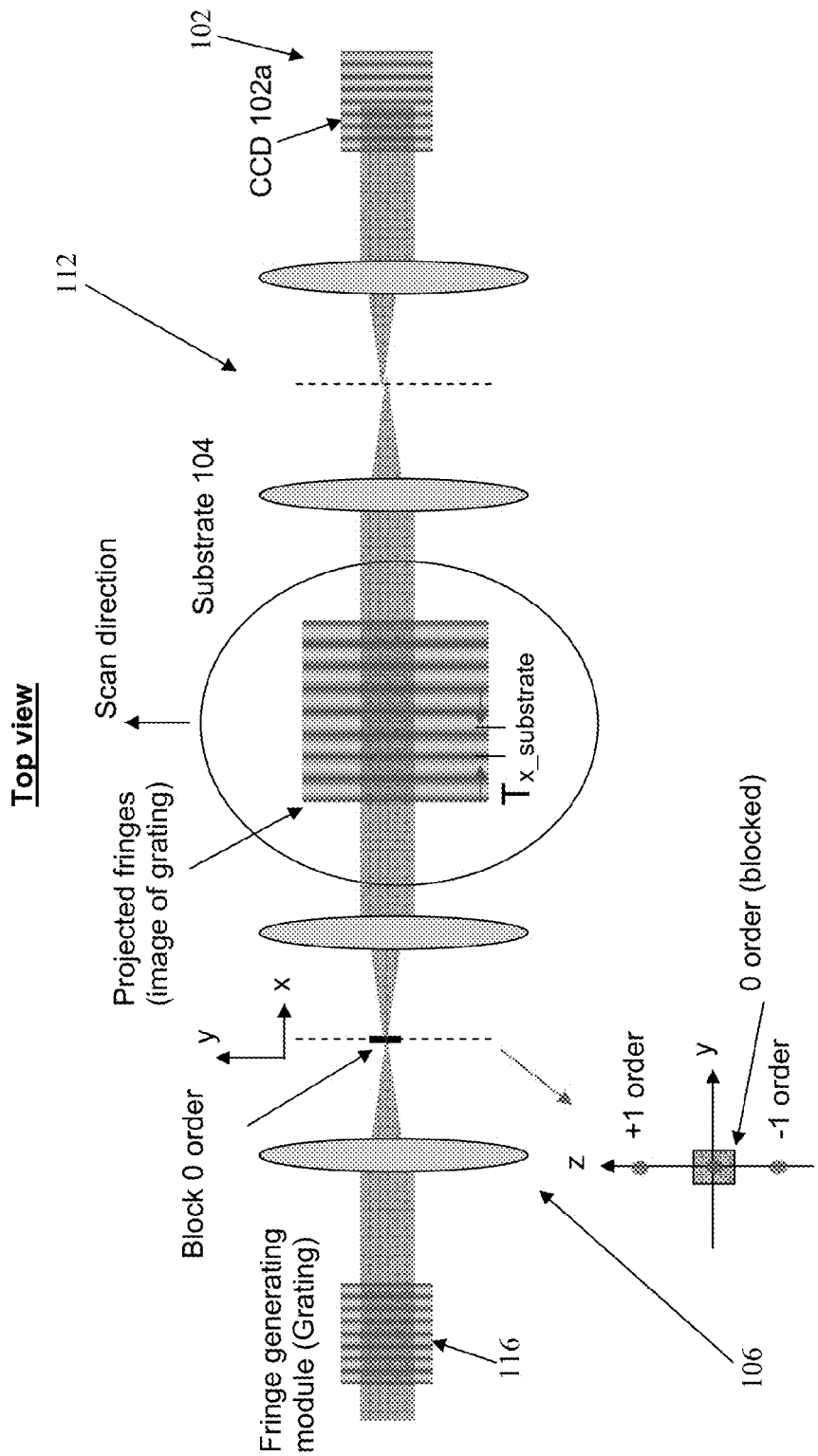

As will be further appreciated by those in the art, e.g. from FIGS. 1-3, the AF system 100 has a sending side that includes the fringe projection system 106, and a grating 116 described below; and a receiving side that includes the relay system 112 and the fringe detection system 102. The fringe projection system 106 produces fringes that comprise two beams associated with each source 108 that are directed onto and reflected by the substrate 104, and then relayed by the fringe relay system 112 to interfere at the fringe detection system 102.

Figure 7:
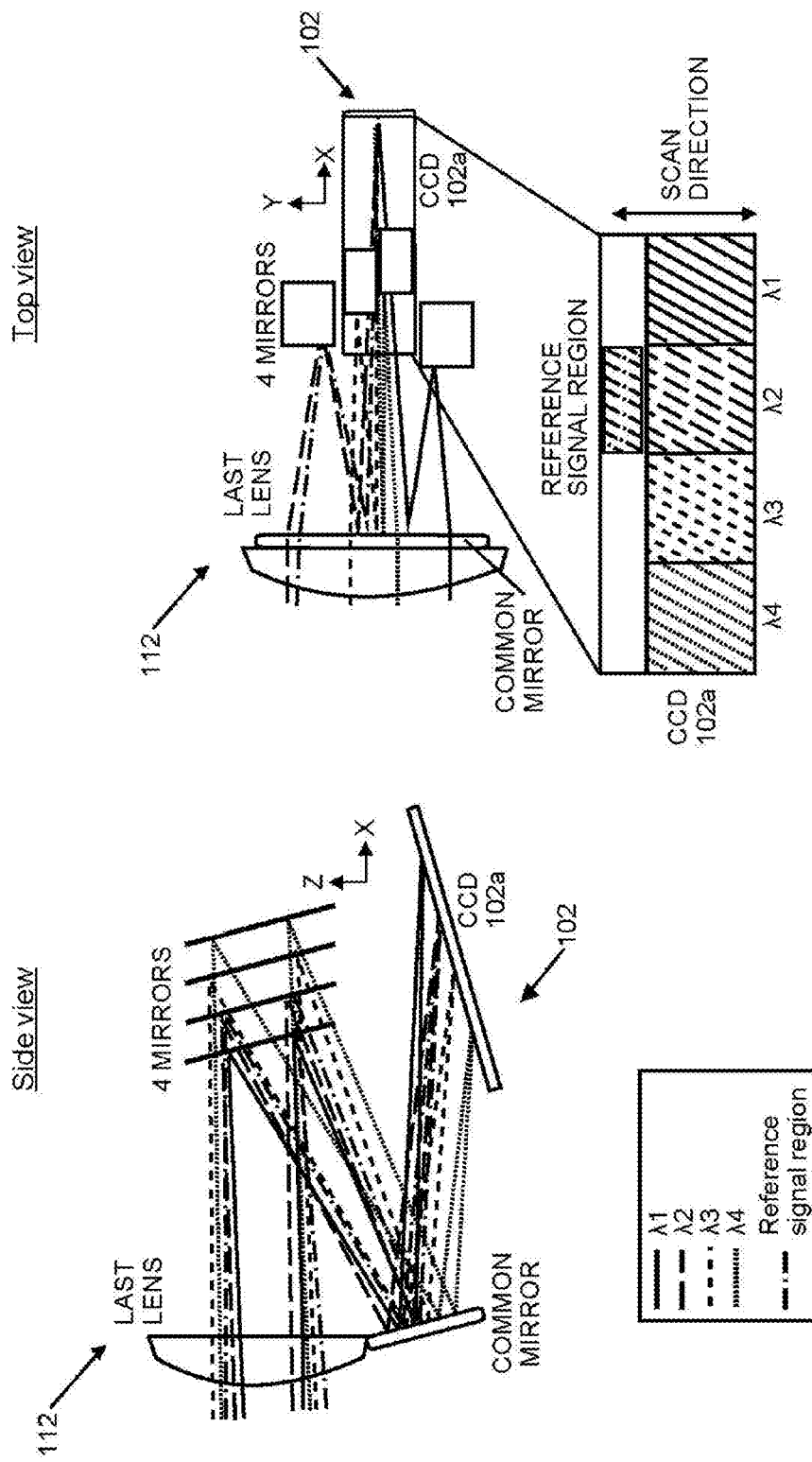
Figure 15:
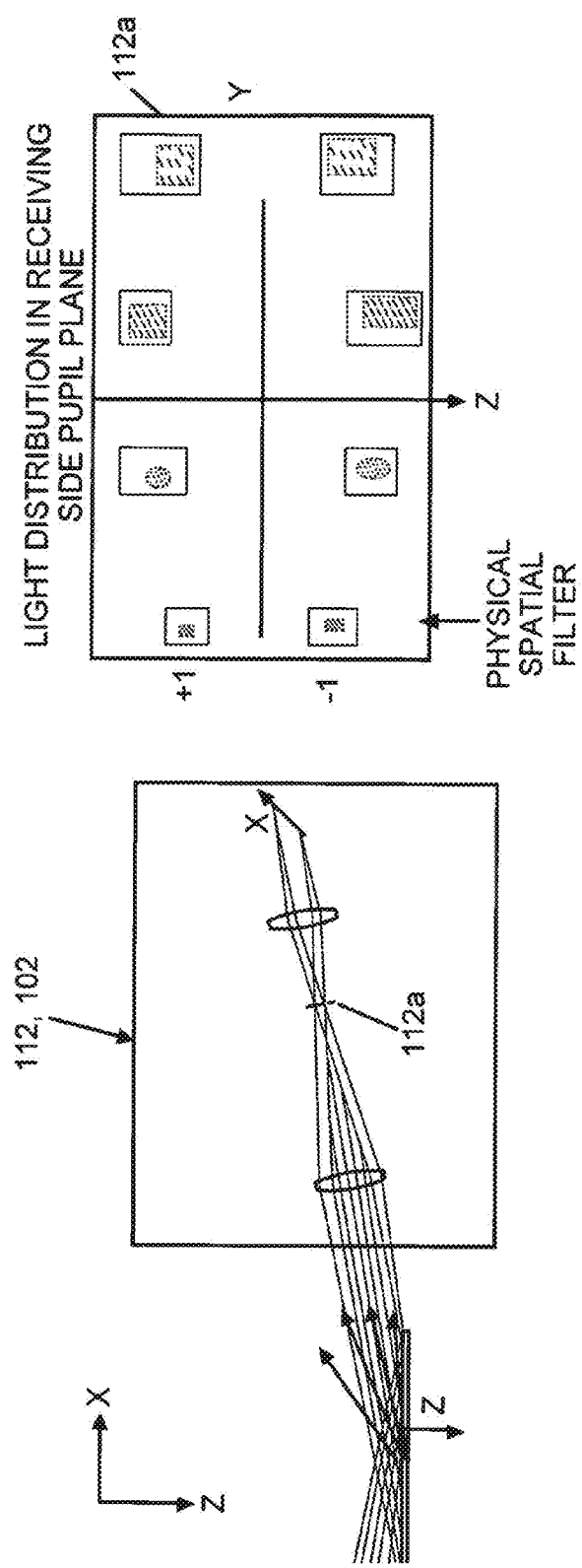

As will be further appreciated from FIGS. 3-7, the fringe projection system 106 comprises a grating 116 that is illuminated by a collimated beam from each source 108. The grating 116 produces +1 and −1 diffracted order beams for each source, and the fringe projection system 106 is configured to direct only the +1 and −1 diffracted order beams onto the substrate 104. The sources 108 are preferably non monochromatic sources, each of which produces a collimated beam that illuminates the grating 116 (as illustrated in FIG. 15, four sources are currently provided, each of which is preferably an LED, and each source provides a collimated beam in a different wavelength band; the different wavelength bands being identified as $\lambda_1$-$\lambda_4$ in several figures). Additionally, the fringe relay system 112 is configured to spatially separate projected beams reflected from the substrate in a manner such that projected interfering beams from each source 108 do not overlap projected beams from other sources at the fringe detection system 102. Moreover, the fringe detection system 102 preferably comprises an area detector 102a (e.g. a charge coupled device or CCD) for detecting projected fringes produced by interfering beams from each source 108. Still further, as schematically illustrated in FIG. 7, a reference signal can be provided, that is reflected from one of the mirrors (e.g. in FIG. 7, the reference signal is reflected from the mirror from which the $\lambda_2$ wavelength is reflected). The reference signal provides a reference fringe pattern in the production of the autofocus information.

As will be further appreciated from FIGS. 9-13, the fringe projection system 104 and the fringe detection system 102 are configured to provide temporal phase shifting in the fringes reflected from the substrate that are relayed to the fringe detection system. More specifically, the fringe projection system 104 and the fringe detection system 102 are configured to provide temporal phase shifting by synchronizing the rate of capture of the projected fringes by the area detector CCD 102a with the movement of the substrate 104 relative to the imaging location, to enable detection of projected fringes at a predetermined set of phase differences from the same region of the substrate to a different region on the area detector CCD 102a as the substrate 104 moves relative to the imaging location. There is no vibrating mirror in the system, and the only moving component that can provide the temporal phase shifting is the substrate 104 that moves relative to the imaging location.

In another feature of the system and method of the present invention, correction is provided for Goos Hanchen effects. As will be appreciated from FIGS. 5-7, the fringe projection system 106 and the fringe relay system 112 are configured to project and relay beams at one or more wavelength bands and one or more polarization states to the area detector 102a, and the processing system 114 is configured to process the detected fringes with a set of coefficients designed to enable compensation for Goos Hanchen errors. As seen from FIGS. 6 and 7, the system is designed so that eight wavelength/polarization measurements can be done simultaneously. The image of the CCD area detector 102a is conjugate to the grating 116, so four wavelengths (shown e.g. at $\lambda_1$-$\lambda_4$ $\lambda_1$-$\lambda_4$ in FIG. 7) will overlap at the CCD. However, the use of fold mirrors between the last lens and the CCD allow four wavelengths to be incident on the same detector. To obtain both linear polarization states, a polarization beam splitter PBS is provided before the last lens, and both polarization states are sent to respective detectors. Therefore, there are two sets of fold mirrors. Each detector has a copy of the reference signal, so that relative drift between the two detectors can be continuously monitored and compensated. Additional information on compensation for Goos Hanchen errors in an optical projection system is provided in U.S. application Ser. No. 12/884,890, entitled "Goos Hanchen compensation in autofocus systems" which is incorporated by reference herein.

In yet another feature of the present invention, the processing system 114 is configured to correct for geometric errors produced by substrate tilt (known as Abbe errors). Specifically, just like a distance measuring interferometer, a projection based AF system will experience errors induced by the tilt of the mirror surface (or substrate in the case of the AF system) under investigation. As an example, take a substrate that is shifted 30 um in z, and tilted about the x-axis 200 urad. If the projected beam is incident on the substrate 86 degrees from normal, the AF error will be about 86 nm—large enough to need compensation. This invention enables the correction of this error via an approximation of the substrate tilt through the numerically evaluated gradient of the fringe phase in the fringe projection AF system 100. The algorithm that provides this correction is described below.

Figure 5:
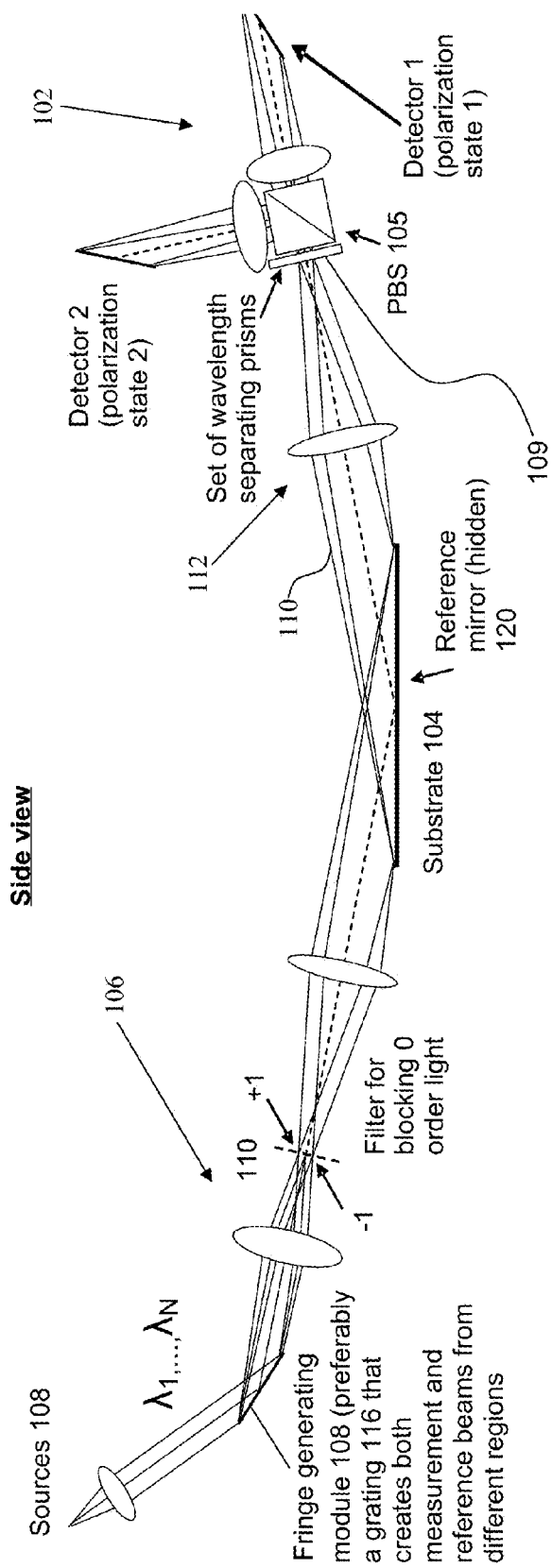
FIGS. 5-8 are schematic illustrations of certain components and optical principles for a system and method according to the principles of the present invention, particularly with respect to the illumination sources, the fringe detection system, and correction of Goos Hanchen effects.
Figure 6:
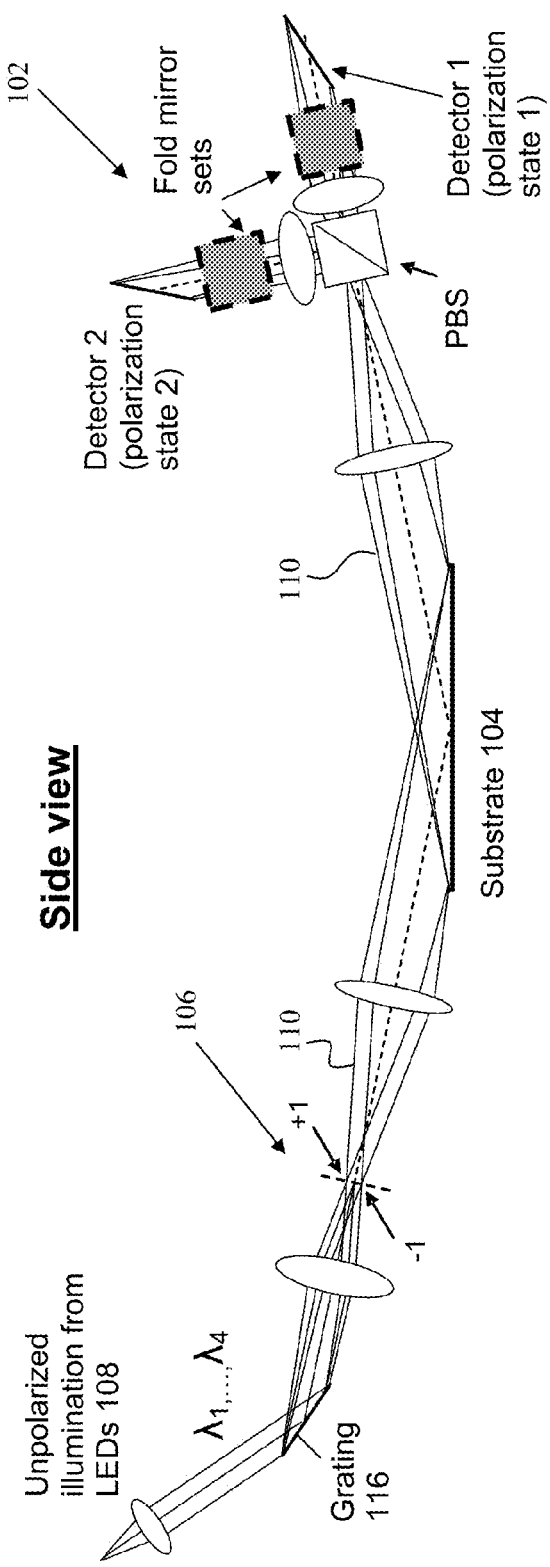
Figure 8:
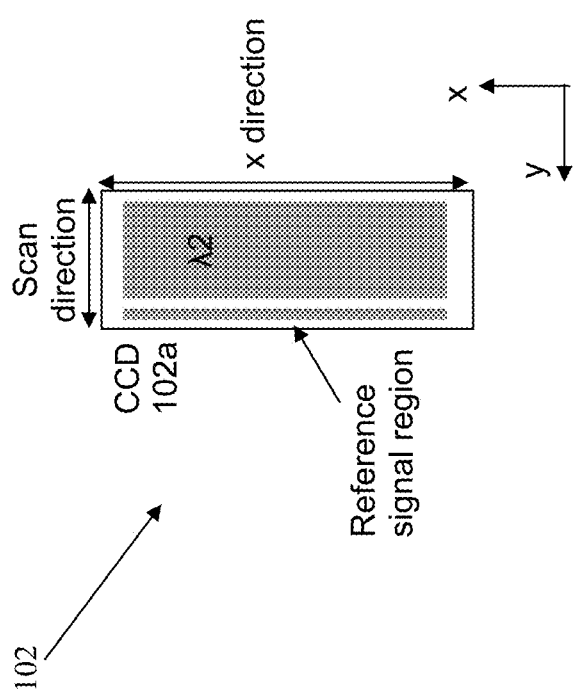
Figure 9:
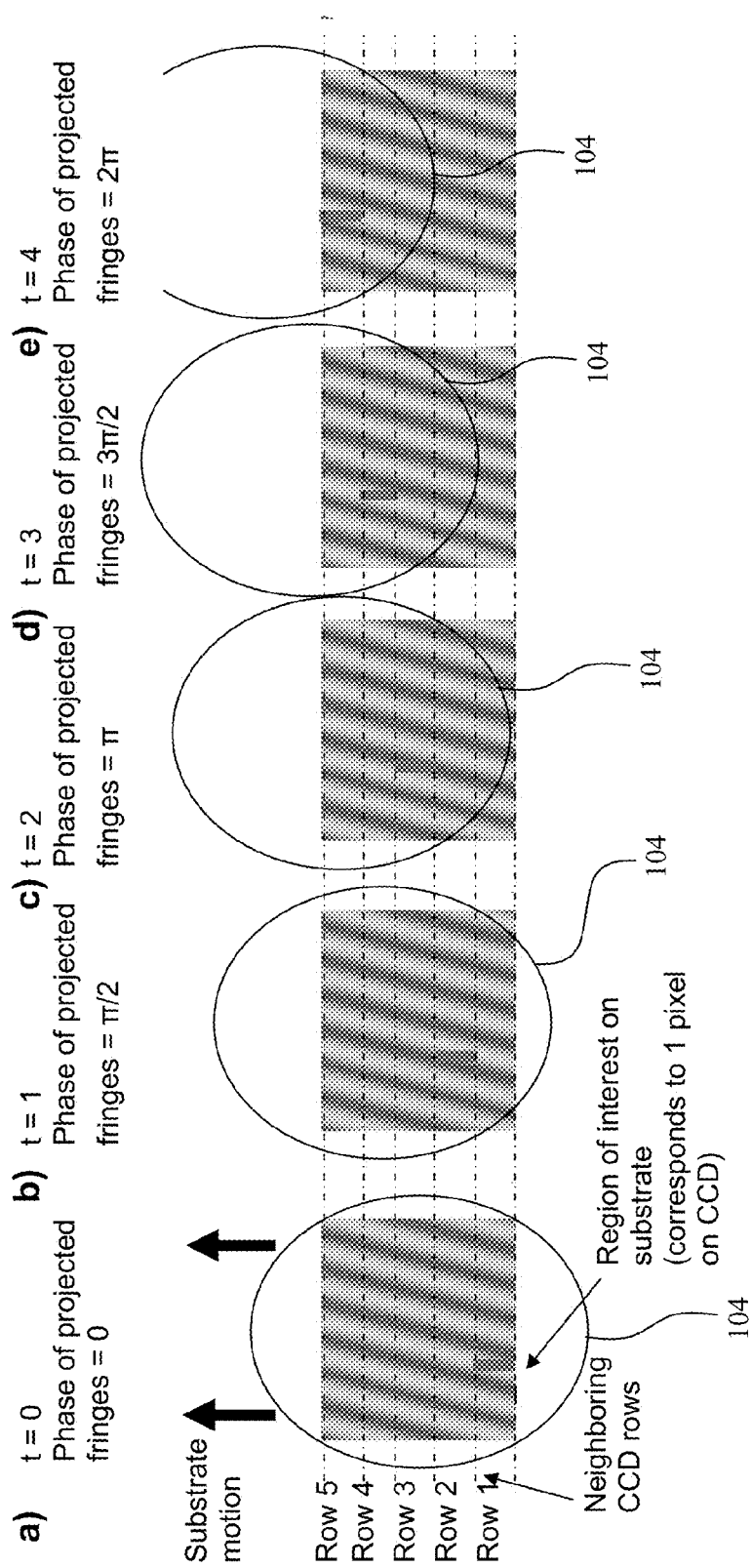
FIGS. 9-13 are schematic illustrations of temporal phase shifting concepts, for a system and method according to the principles of the present invention.
Figure 10:
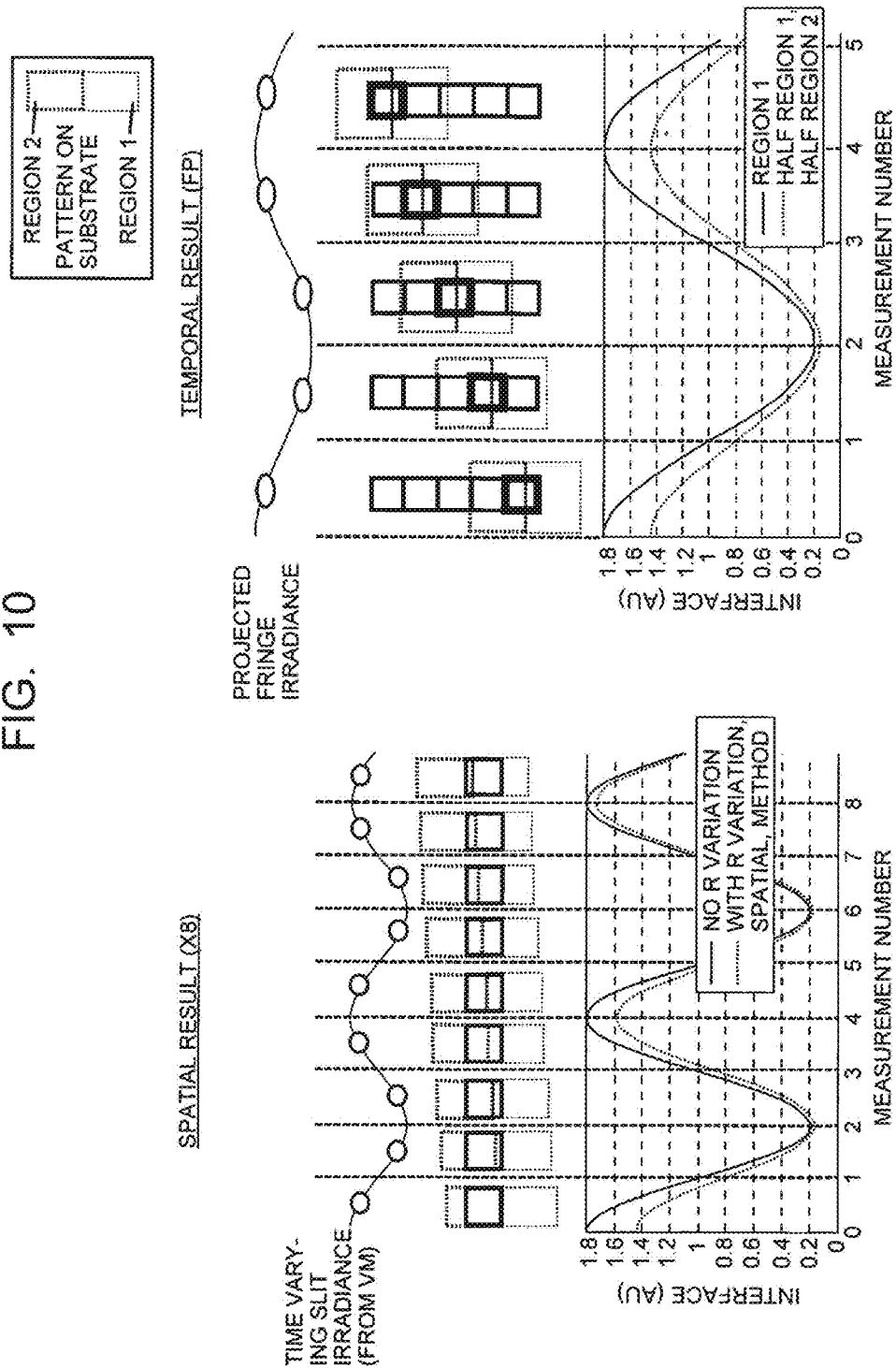
Figure 11:
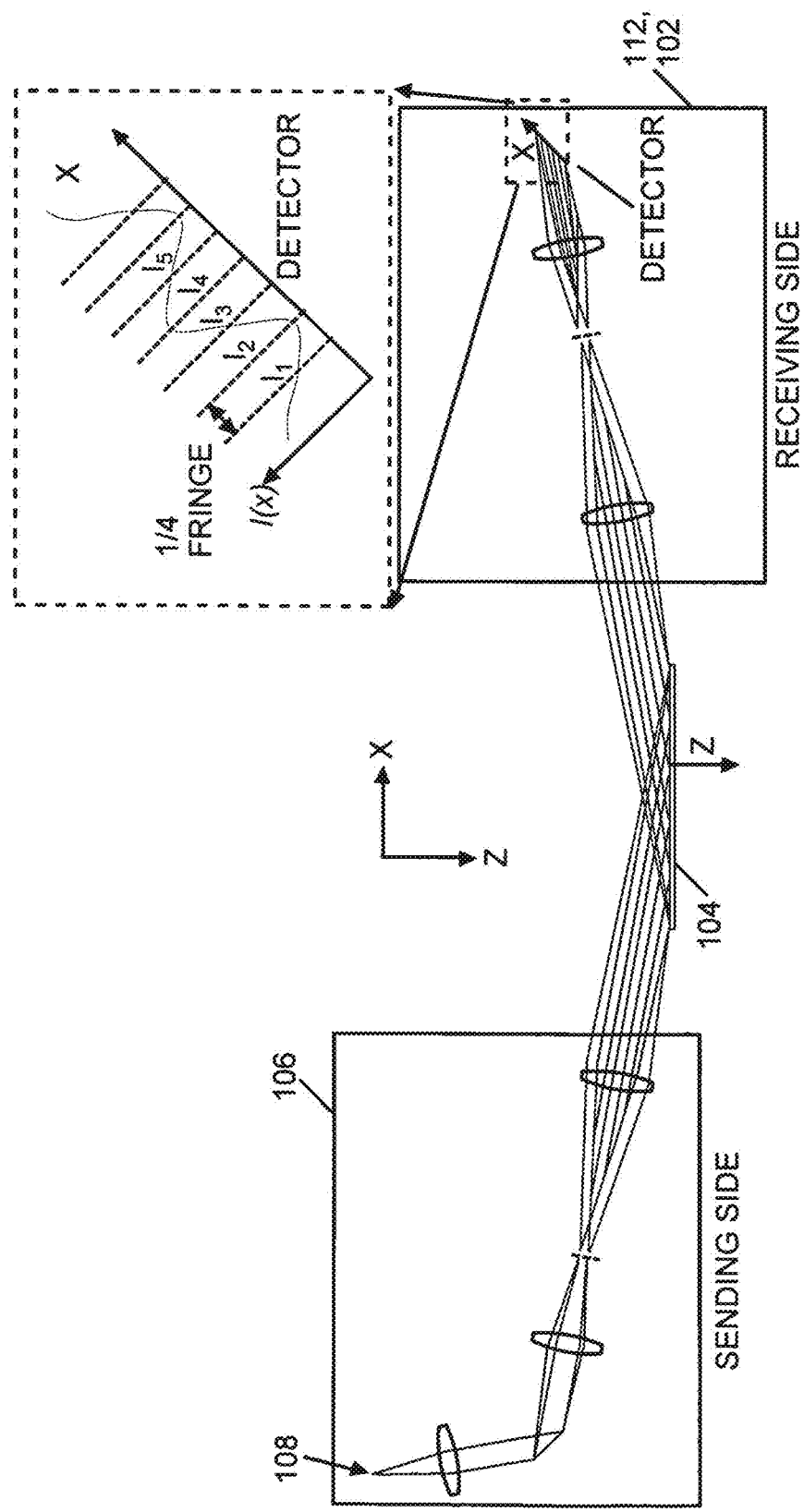
Figure 19:
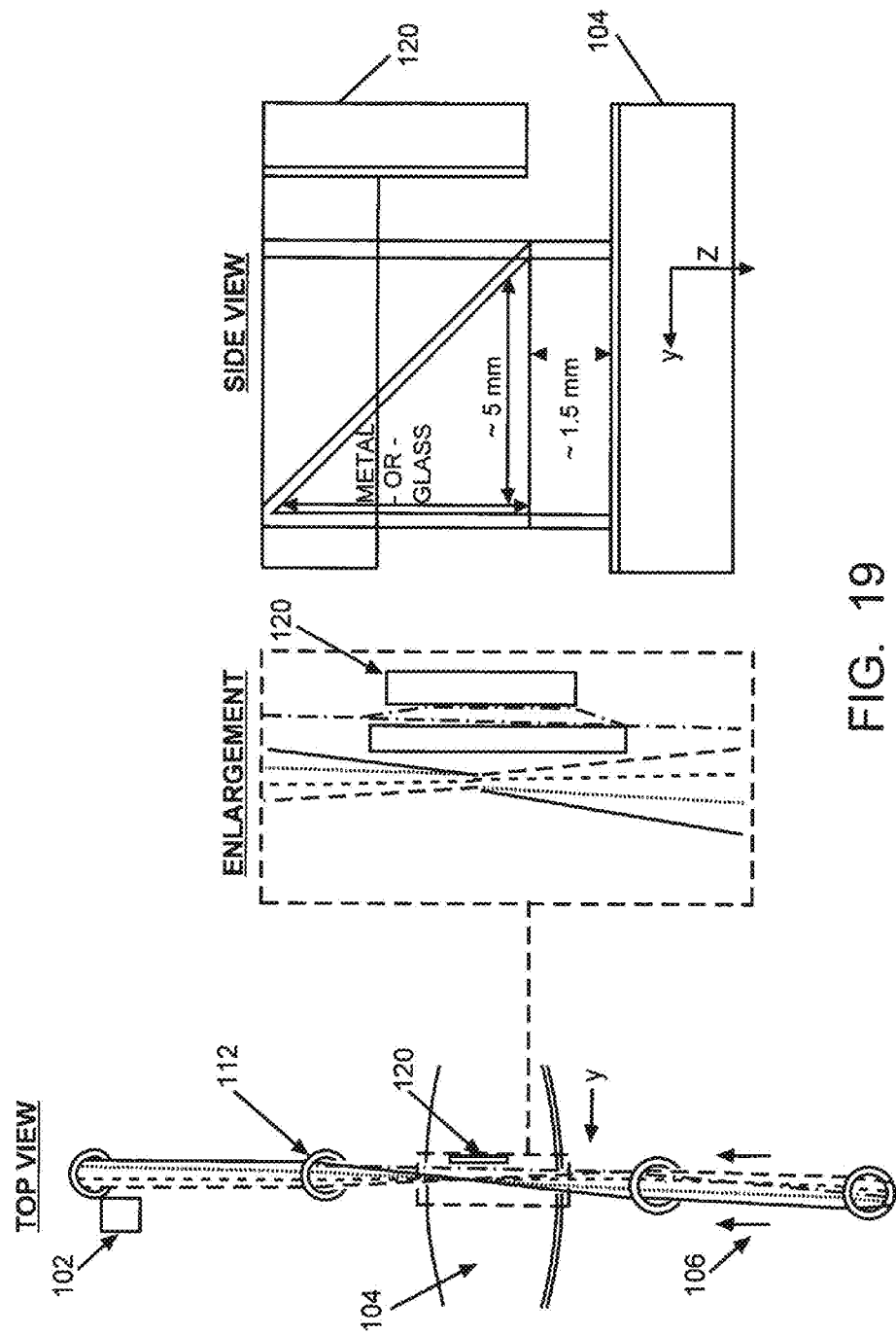
FIG. 19 is a schematic illustration relating to the use of a reference mirror for a system and method according to another aspect of the present invention.

Still further, as illustrated by FIGS. 5, 8 and 19, the fringe projection system 106 can be configured to project beams from at least one source 108 to a reflector 120 (i.e. a reference mirror) that is separate from the substrate 104, and beams from the reflector 120 are projected to the detection system 102 for use by the processing system 114 as a reference fringe pattern in the production of the autofocus information. On the fringe generating grating 116, a region on the side will generate a reference pattern that uses the same optics but is incident on the reference mirror 120 instead of the substrate 104 (FIGS. 5, 19). The reference mirror 120 is optically coincident with the substrate surface. Thus, since the reference light is nearly common path, it should experience many of the same environmental changes as the measurement light, thereby reducing the likelihood of error. The reference light is detected on the same CCD area detector 102a as the reference light (FIG. 8), so that any motion of the CCD relative to the autofocus optics will cause changes in both the measurement and reference values. Also, the reference mirror can compensate for mechanical drift of many of the optical components.

Also, as illustrated by FIGS. 14-18, a system and method according to the present invention can be configured to provide spatial filtering of the fringes that are projected to the fringe detection system 102. The spatial filtering can be provided in the fringe relay system 112 by a spatial filter 112a located in the pupil plane, where the spatial filter 112a is configured to suppress scattered light projected from the substrate 104 while passing specularly reflected light from the substrate. Alternatively, the processing system 114 is configured to spatially filter data from the fringe detection system 102 to remove pattern induced errors outside a predetermined spatial frequency range.

Figure 18:
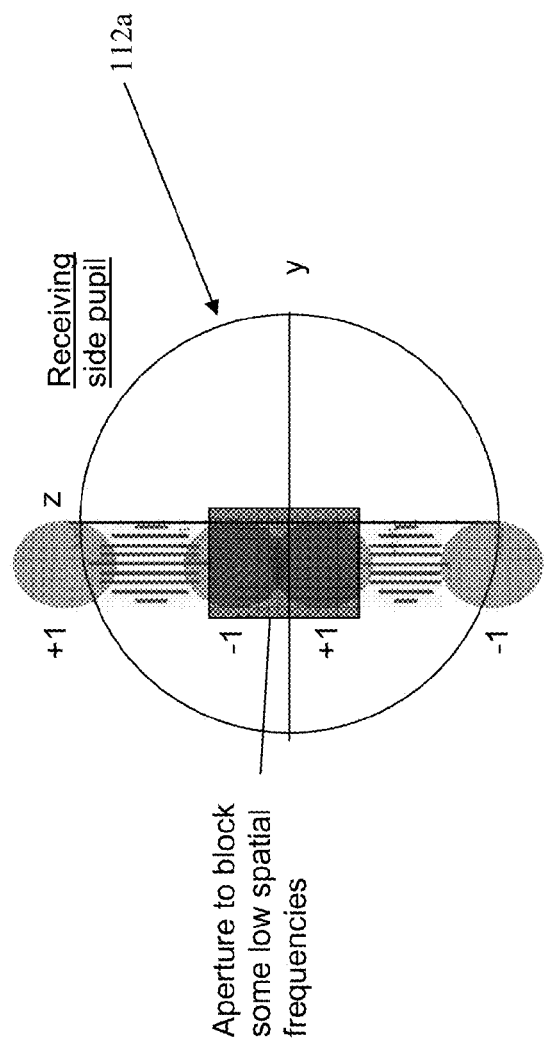

In a system and method that uses the spatial filter 112a, each of the four wavelengths (from the four sources) is incident slightly out of the xy plane (see FIG. 14), so the different wavelengths are spatially separated in y in the receiving side pupil plane. The spatial filter 112a transmits the specularly reflected light and blocks virtually all other light, and this eliminates errors due to many spatial frequencies. Also, as seen from FIG. 16, patterns in x at the same frequency as the projected fringes will diffract some of the light to overlap the opposite fringe projection order in the pupil. It cannot be filtered with the filter, but simulations show this spatial frequency doesn't cause errors. As shown further in FIG. 17, patterns in x above a certain frequency will diffract light out of the pupil, so that any pattern with above that frequency will be removed by the optics and won't cause errors. Additionally, as shown in FIG. 18, the physical spatial filtering should remove all spatial frequencies above a certain level that are not removed by software, and frequencies below that level can be partially removed (depending on the source size and substrate tilt) by placing an aperture between the +1 and −1 orders of the projected fringes.

The fringe projection system 106, the fringe relay system 112, the fringe detection system 102, and the processing system 114 can also be configured to allow unambiguous autofocus processing. As illustrated in various figures, the system of the present invention uses fringes that are projected to the detector system 102 via glancing reflection off the substrate 104. The fringe projection system 106 is configured so that the rate of fringe shift with substrate height is different for the different sources, and the processing system 114 is configured to estimate the unambiguous height of the substrate. The principles underlying this concept are described below.

The amount the fringes shift, $\Delta x$, for a given substrate height change, $\Delta z$, depends on the average angle of incidence of the two beams, $<\Theta>$, used to generate the fringes. The following fringe shift approximation is exact when the wave vectors are in the x-z plane and the substrate is parallel to the x-y plane.

$$\text{fringe shift} = \Delta x \approx 2\Delta z \tan(\langle \theta \rangle) \quad (1)$$

The ratio of fringe shift to substrate height change is what we call the "fringe shift sensitivity", and in this case it is simply $2*\tan(<\Theta>)$.

One potential issue with this approach is that the fringe phase repeats periodically as the substrate moves in z, so that the fringe phase can only be defined modulo $2\pi$. As a result there is an ambiguity in the substrate height of, $$\text{ambiguous substrate height} \approx \frac{\Lambda_x}{2\tan(\langle\theta\rangle)} \quad (2)$$

where $\Lambda_x$ is the fringe period on the substrate in the x-direction.

Derivation of Fringe Shift Sensitivity—$\psi$

This invention exploits a natural variation in fringe shift sensitivity among several measurement channels, which may exist simultaneously in a single fringe projection AF system. We call this variation in fringe shift sensitivity, "fringe shift diversity".

As an example of a multi-channel fringe projection AF system, each channel could use a single wavelength, or wavelength band, and each band is sensed by a different detector or set of detector elements on a CCD. In this case the various channels could be combined and separated with dichroic beam splitters, for example. However, the methods of implementing a multichannel fringe projection system are numerous. Thus, to properly describe the source of the difference in the fringe shift diversity, it is advantageous to frame the situation in the space of the substrate—as if the fringe generator and substrate are conjugate via a 1:1 imaging system. To that end, assume that a single wavelength plane wave is incident on a linear reflective grating which reflects 0, +1, and −1 orders. The 0 order will be removed in the far field by a spatial filter in the pupil of the fringe projection optics, and the +1 and −1 orders will be used to generate the 2-beam interference fringes that are reflected from the substrate and relayed to a detector, which is also, for our purposes here, at a 1:1 conjugate.

We'll assume that the optical axis of the imaging optics is contained in the x-z plane and makes an angle of $\Theta$ with the surface normal of the substrate. The direction of the 0-order beam has direction cosines of $\{\alpha_i, \beta_i, \gamma_i\}$ in the coordinates of the optical axis of the imaging optics, and $\{\alpha_0, \beta_0, \gamma_0\}$ in the coordinates of the substrate/grating/detector. The two coordinates are related by a simple rotation of $\Theta$ about the y-axis.

$$\alpha_0 = \alpha_i \cos\theta + \gamma_i \sin\theta$$

$$\beta_0 = \beta_i$$

$$\gamma_0 = -\alpha_i \sin\theta + \gamma_i \cos\theta \quad (3)$$

The directions of the +1 and −1 order are given by the grating equation and can be expressed in terms of the wavelength, $\lambda$, the fringe frequency vector $\{f_x, f_y\}$ (which is twice the grating frequency, but in the same direction) and the 0-order direction cosines as, $$\alpha_{\pm 1} = \alpha_0 \pm \tfrac{1}{2}\lambda \cdot f_x$$

$$\beta_{\pm 1} = \beta_0 \pm \tfrac{1}{2}\lambda \cdot f_y$$

$$\gamma_{\pm 1} = \sqrt{1 - \alpha_{\pm 1}^2 - \beta_{\pm 1}^2} \quad (4)$$

The phase of the interference fringes produced by the +1 and −1 orders on the substrate is given by, $$\phi_w = \frac{2\pi}{\lambda}[(\alpha_{+1} - \alpha_{-1})x + (\beta_{+1} - \beta_{-1})y + (\gamma_{+1} - \gamma_{-1})z] \quad (5)$$

The change of fringe phase with respect to z can be obtained by differentiation. However, because the substrate is used in reflection on the way to the detector, the change in phase with respect to z at the detector is twice that on the substrate.

$$\frac{\Delta\phi_d}{\Delta z} = \frac{4\pi}{\lambda}(\gamma_{+1} - \gamma_{-1}) = \frac{4\pi}{\lambda}\Delta\gamma \quad (6)$$

The fringe shift sensitivity (in the x-direction), $\psi$, is $$\psi = \frac{\Delta x}{\Delta z} \quad (7)$$

$$= \frac{1}{2\pi f_x} \cdot \frac{\Delta\phi_d}{\Delta z}$$

$$= \frac{2\Delta\gamma}{\lambda f_x}$$

$$= \frac{2}{\lambda f_x}\left[\sqrt{1-\alpha_{+1}^2-\beta_{+1}^2} - \sqrt{1-\alpha_{-1}^2-\beta_{-1}^2}\right]$$

$$= \frac{2}{\lambda f_x}\left[\begin{array}{c}\sqrt{1-\left(\alpha_0+\frac{\lambda f_x}{2}\right)^2-\left(\beta_0+\frac{\lambda f_y}{2}\right)^2} - \\ \sqrt{1-\left(\alpha_0-\frac{\lambda f_x}{2}\right)^2-\left(\beta_0-\frac{\lambda f_y}{2}\right)^2}\end{array}\right]$$

$$\psi = \frac{2}{\lambda f_x}\left[\begin{array}{c}\sqrt{\gamma_0^2-\lambda(\alpha_0 f_x+\beta_0 f_y)-\frac{\lambda^2}{4}(f_x^2+f_y^2)} - \\ \sqrt{\gamma_0^2+\lambda(\alpha_0 f_x+\beta_0 f_y)-\frac{\lambda^2}{4}(f_x^2+f_y^2)}\end{array}\right]$$

If we express the fringe vector in terms of the absolute fringe frequency and its angle from the x-axis the fringe shift sensitivity $\psi$ becomes $$\psi[\lambda, \alpha_0, \beta_0, \gamma_0] = \frac{\Delta x}{\Delta z} \quad (8)$$

$$= \frac{2}{\lambda f \cos \delta} \left[ \sqrt{\gamma_0^2 - \lambda f(\alpha_0 \cos \delta + \beta_0 \sin \delta) - \frac{\lambda^2 f^2}{4}} - \sqrt{\gamma_0^2 + \lambda(\alpha_0 \cos \delta + \beta_0 \sin \delta) - \frac{\lambda^2 f^2}{4}} \right]$$

Typically, the first and second terms within the square root are of the same order of magnitude, while the final term, quadratic in wavelength is typically several orders of magnitude smaller.

From equation (8) we can see that the fringe sensitivity depends on the angle of the 0-order beam, which can be thought of as the angle of illumination, the wavelength, and the fringe vector. Note that the middle term in the square root determines the interaction of the y-direction cosine of the angle of illumination and the rotation of the fringes. This term gives us an additional degree of freedom in determining the fringe shift sensitivity.

Using Fringe Shift Diversity

If ψ did not vary with wavelength or direction of illumination, then all of the measurement channels would have the same sensitivity. However, because of equation (8) each one is different and we can use this to determine the absolute z-position since the difference between the fringe shifts is also a function of substrate height, but does not repeat for a much larger range of z. In fact the ambiguous range between measurement channels a and b is given by, revised ambiguous range=$[(\psi[\lambda_b, \alpha_b, \beta_b, \gamma_b] - \psi[\lambda_a, \alpha_a, \beta_a, \gamma_a]) f_x]^{-1}$ (9)

With the system and method concepts described herein, this can translate into several times the unambiguous range of a single channel. Using the two extreme wavelengths, the unambiguous range is actually 101 μm with fringe shift diversity, and 15.5 μm without. Using the nearest two, it becomes almost 300 μm. Using a combination of several channels can extend the unambiguous range, practically, indefinitely.

The unambiguous height, within the range (9), can be determined by, $$\Delta z = \frac{\Delta x_{ab}}{\psi[\lambda_b, \alpha_b, \beta_b, \gamma_b] - \psi[\lambda_a, \alpha_a, \beta_a, \gamma_a]}, \quad (10)$$

where $\Delta x_{ab}$ is the difference in fringe positions between channels a and b.

This aspect of the present invention overcomes one of the basic possible issues with fringe projection based autofocus—the ambiguity in measured substrate height that results from the periodic fringe pattern and its depth of focus.

Figure 20:
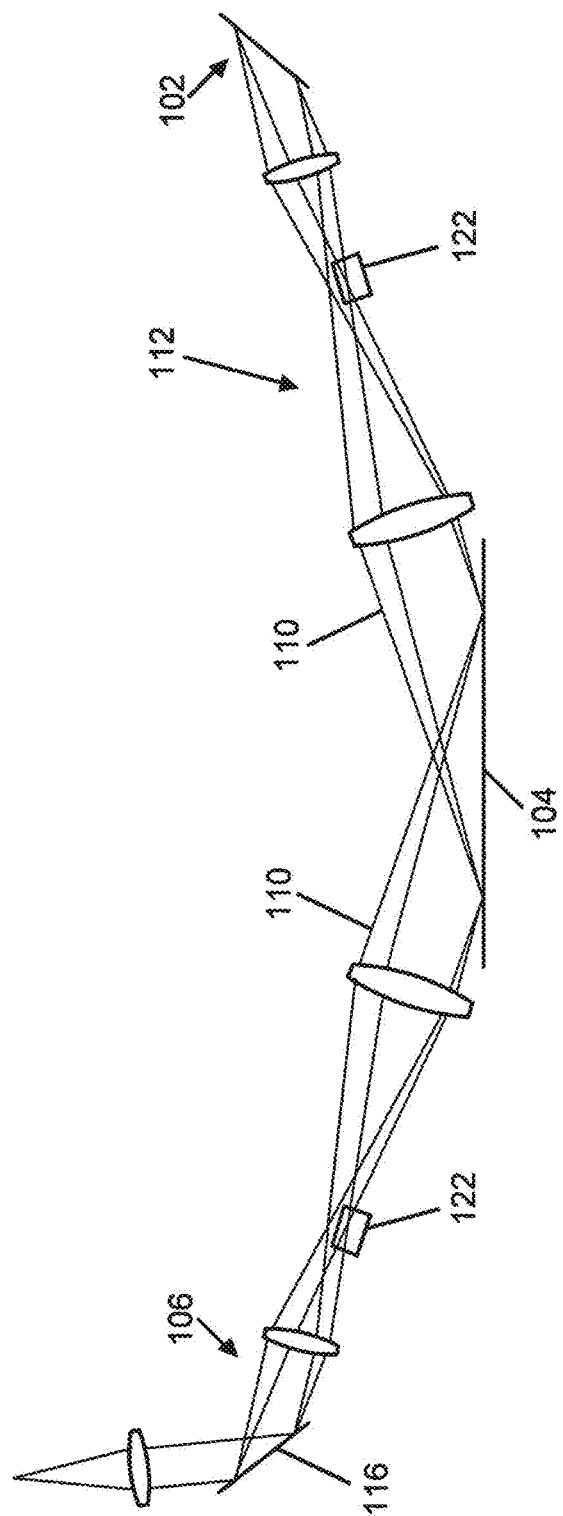
FIG. 20 is a schematic illustration of the concept of introducing optical delay into a system and method, according to the principles of the present invention.

In yet another aspect of the present invention, and illustrated in FIG. 20, the fringe projection system 106 is configured to introduce a delay in one of the two beams associated with each of the one or more sources that is longer than the respective coherence length, and the relay system 112 is configured to introduce a compensating delay in the other of the two beams associated with each of the one or more sources, producing fringes at the detector and not at the substrate and reducing the effect of light scattered by the substrate.

Specifically, in the system of FIG. 20 a delay is produced for one beam in the two beam interference fringes nominally projected to the substrate in an AF system. The delay is made to be longer than the coherence length of the source so that the contrast of the fringes at the substrate 104 is substantially reduced. Then a compensating delay is inserted into the optics of the relay system 112 that relays the beams from the substrate to the detector. The compensating delay recovers the fringe contrast, but also destroys the image of the substrate that would be formed without the second delay. Each delay could, for example, be produced with simple glass plates 122, each with a preferably high index of refraction and dispersion.

In the case that several sources (having difference center wavelengths) are used, and furthermore separated in the pupil, it is advantageous to use different delays for each wavelength so that light from the various sources scattered by the substrate 104 will be further rejected due to coherence length. This approach may require very large delays and a more complex imaging system, but may be well worth the tradeoff.

The purpose of providing the delays, in a system and method according to the present invention, is to reduce sensitivity to substrate patterns in a fringe projection autofocus system. The system and method of FIG. 20 does so in a way that is fundamentally different than aperture based spatial filters, and in such a way that it may be more effective in reducing sensitivity for patterns that are aligned with the x-axis (perpendicular to the scan direction). In accordance with the principles of the present invention, the system and method is compatible with fringe projection, and it is not troubled by substrate tilt.

Further aspects of the system and method concepts of the present invention are described below.

Spatial Filtering Concept

In a fringe projection AF system and method of the type described herein, very often, the substrate has a pattern already deposited beneath the resist. This pattern is then superimposed on the fringe pattern that arrives at the detector 102. In some cases, the imaged substrate pattern has sufficient contrast at certain frequencies that can confuse the AF system. The spatial filtering aspect of the present invention provides a means for mitigating this effect in a fringe projection AF system and method of the type described herein.

This aspect of the present invention deploys a spatial filter to remove frequency components that can cause problems for the fringe projection system.

In one embodiment of this concept, the spatial filter is a physical component placed in the pupil of the receiving side (which includes the detector 102)—where the two beams that produce the desired fringes at the substrate 104 and detector 102, become images of the source. FIG. 3 shows the basic AF fringe projection system and method described above, including spatial filters 106a, 112a on the sending and receiving sides of the system, respectively.

In other embodiments of this concept, the spatial filter is applied as a software filter, either by operating on the sensed imaged of the fringes in the frequency domain, or by spatial filtering operations that are inherent in the fringe phase estimation.

The key to this aspect of the present invention is that it takes advantage of the simplicity of the fringe projection approach, which images the simplest possible alignment mark—a single spatial frequency. This makes it easier to remove all other offending frequencies and thereby strongly attenuate AF errors due to substrate patterns.

AF Temporal Phase Shifting Concept Using No Moving Parts

This aspect of the present invention, described above with respect to FIGS. 9-13, provides temporal phase shifting in the basic autofocus fringe projection system and method to achieve reduced sensitivity to patterns on the substrate without using any moving parts, which also improves the inherent stability of the autofocus system and method.

A current, known auto focus (AF) system uses a vibrating mirror to obtain an AC signal that relates to the substrate height. In the new, basic autofocus system and method concepts described herein, an image of sinusoidal fringes is imaged onto the substrate, and then the image from the substrate is projected onto the detector 102 via the relay system 112. Measuring the phase of these fringes provides information that can be used to determine the height of the substrate; the primary objective of the basic fringe projection AF system and method.

To explain this aspect of the present invention, it is initially noted that although fringe projection is not an interferometer, it is useful to look at detecting the phase of the projected fringes from an interferometric point of view. In traditional phase shifting interferometry, the fringe phase is shifted in time, usually in steps of $\pi/2$ radians. There are many ways to accomplish this, and the method is generally referred to as temporal phase shifting. There are also methods where a tilt is introduced between the two wavefronts, creating tilt fringes of the right frequency such that there is a $\pi/2$ phase shift between neighboring pixels on the detector, allowing the phase shift to be achieved by comparing a set of 4 or 5 neighboring pixels. Since all the phase shifting is captured in a single camera frame, this is a simple method for spatial phase shifting, so named because each pixel (with the differing phases) is looking at a different region on the substrate.

One way of implementing this concept in a fringe projection system and method is to use a micro-mirror array that can electronically shift the fringes. The problems with this approach are that it is expensive, and it is likely to generate a lot of heat. Also, any angle or timing repeatability errors will likely lead to errors in determining the substrate height. An alternative approach is to use a fixed grating pattern 116 to generate the fringes, as shown in the figures.

With the system design, neighboring pixels can have a phase shift of the projected fringes of $\pi/2$, allowing 4 or 5 neighboring pixels to be used to calculate the phase, and therefore the substrate height. This would work quite well for a bare Si substrate, or even for a substrate with a multi-layer structure on it.

Typically, substrates will have some sort of pattern (circuit design) when measured with an auto focus system. If the spatial frequency of the reflectance variations of these patterns is equal to the spatial frequency of the projected fringes, then the reflectance variation can cause large errors. This is because the reflectance variation looks like a false phase shift when using a spatial phase shifting technique. These reflectance variations can be on the order of +/−25% for a large range of spatial frequencies.

The large errors, although over a limited frequency range (roughly $0.5*f_{FP}$ to $1.5*f_{FP}$, where $f_{FP}$ is the fringe projection spatial frequency), are highly undesirable in a substrate autofocus system. In accordance with the principles of the present invention, applicants have determined that temporal phase shifting, where each location on the substrate is measured sequentially in time with fringes at $\pi/2$ phase steps, would be much less sensitive to errors due to substrate patterns, and will allow for much faster data processing than phase steps much different from $\pi/2$.

Thus, this aspect of the present invention provides for performing temporal phase shifting without using any moving parts, other than the substrate motion past the AF imaging location. Rotating the sending side grating 116 which rotates the imaged fringes slightly on the substrate, as shown in FIG. 12, allows temporal phase shifting by taking advantage of the substrate motion.

Figure 12:
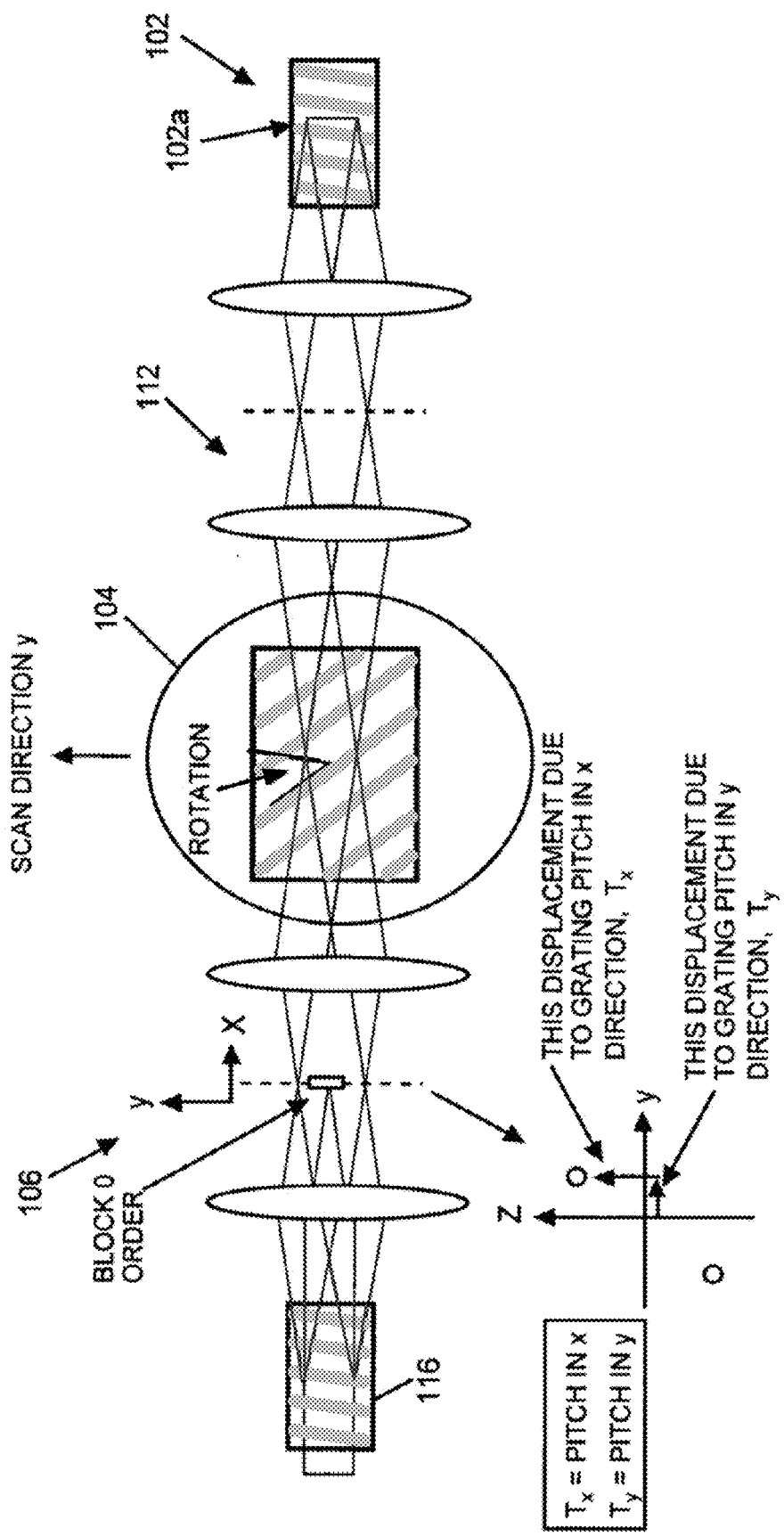
Figure 13:
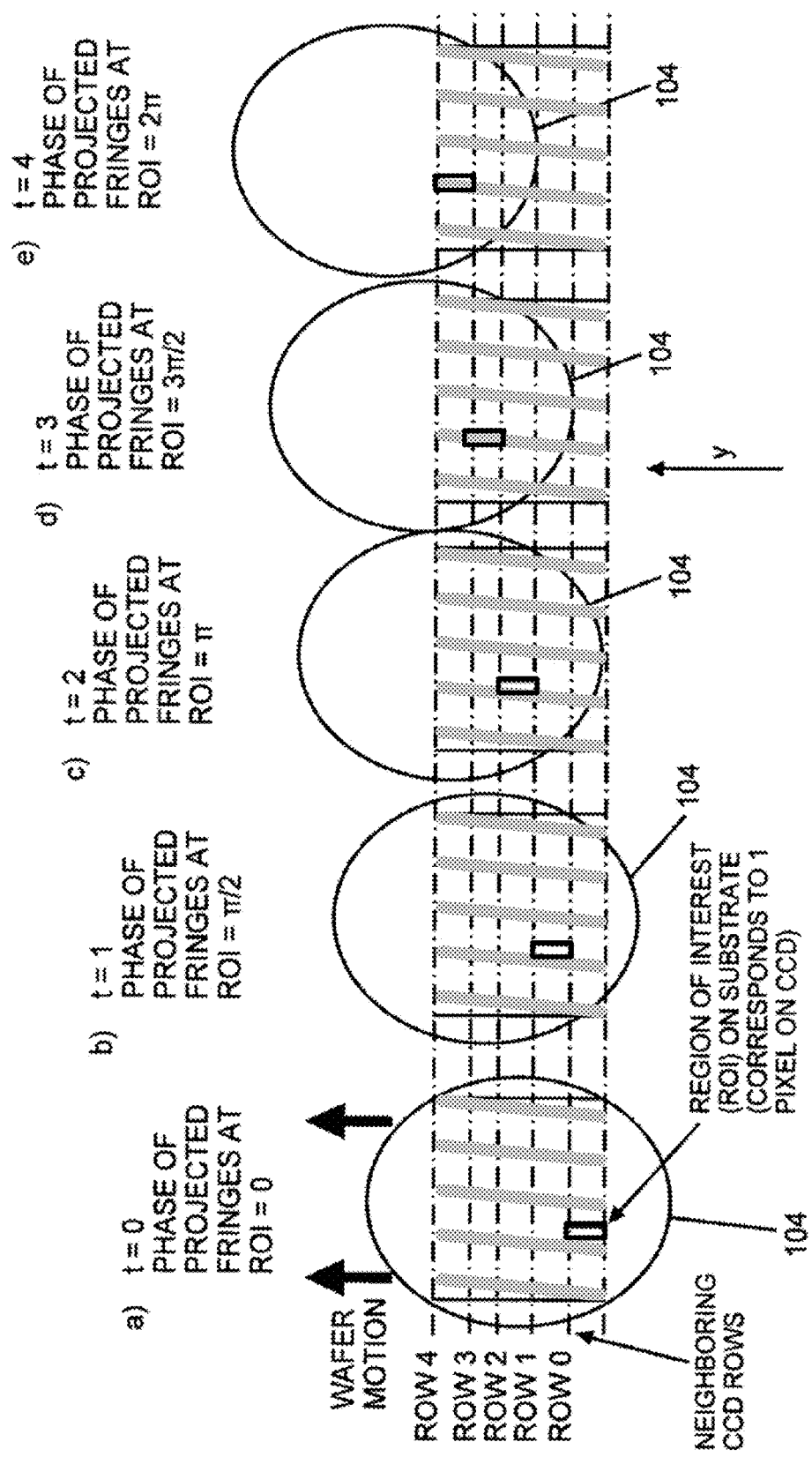
Figure 14:
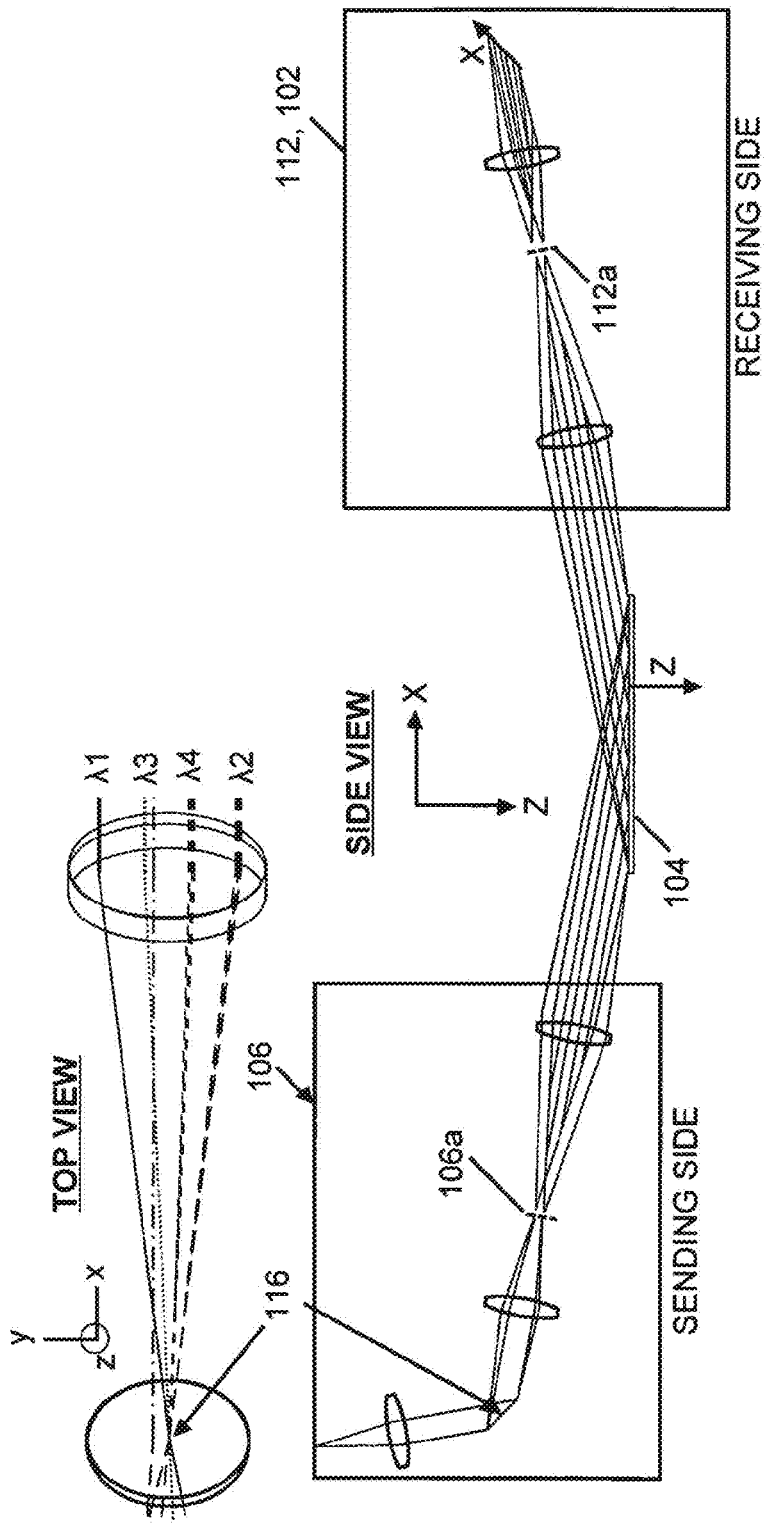

As the substrate moves in the scan direction as indicated in FIG. 12, the phase of the projected fringes at a given region on the substrate changes in time. Two parts of the system need to be synchronized in order to get optimal performance in this type of system. First, the rotation angle of the projected fringes is set such that the phase of the projected fringes incident on neighboring rows of pixels on the two dimensional CCD area detector 102a are offset in phase by the desired phase step, $\phi$. Typically, this phase step would be $\phi=\pi/2$. This system design constraint is independent of the substrate velocity.

The second part of the system that must be synchronized is the timing of subsequent CCD frames must be synchronized with the substrate velocity in the scan (y) direction. This should be set such that a given region on the substrate is aligned with pixel row 0 for frame t=0 (with the phase of the projected fringes at $\phi=0$), row 1 for frame t=1 ($\phi=\pi/2$), etc, as shown graphically in FIG. 13. The 5 pixel values required to solve for the phase would be given, for example, as (frame, row, column)=[(0, 0, c), (1, 1, c), (2, 2, c), (3, 3, c), (4, 4, c)].

The main goal of this aspect of the fringe projection system and method of the present invention is to provide for phase shifting of the fringes that is less sensitive to periodic reflectance variations on the substrate. The spatial sampling of the CCD detector 102a is much finer than the final desired spatial resolution at the substrate, so the digitized data can be filtered in Fourier space to remove high spatial frequency errors higher than the desired spatial frequency.

If an AF system is built using the rotated grating 116 and synchronization described here, it will be able to run in the temporal phase shifting method with no moving parts. However, it could also be used in spatial mode, simply by changing the algorithm used to process the data; the data is collected in the same way regardless of the algorithm used. This might be advantageous when the pattern (reflectance variation) content of the substrate being measured is known before hand. For example, if it is know that there are no patterns with a spatial frequency between 1 cyc/mm and 3 cyc/mm, but there are a lot of features below 1 cyc/mm, it is advantageous to use the spatial algorithm (comparing FIGS. 3 and 6). Another option is to use both methods and look at the effects due to patterns for each result, and simply use the best one.

The fact that either phase shifting method can be accomplished with no moving parts is important from a system stability, and therefore, accuracy point of view. Highly accurate and repeatable motion over long periods of time is required in current AF systems, and errors in this motion are often the limiting factor in the accuracy and stability of these AF systems. The lack of moving parts will allow the fringe projection system and method to achieve much higher inherent stability. In addition, there will not be any heat generated by the fixed grating, as there would be for any moving part.

Thus, this aspect of the present invention provides a simple way to get temporal phase shifting of the projected fringes in a fringe projection AF system and method, where each region on the substrate is measured with a set of 5 or more phase values varying in phase steps of $\pi/2$, to reduce the errors from reflectance variations on the substrate. The important part of the this concept is that it is accomplished with no moving parts (except the substrate), removing major heat sources and stability issues inherent to any moving part, allowing higher accuracy surface measurement due to increased system stability.

Unambiguous Height Measurement in Fringe Projection using Fringe Shift Diversity The basic fringe projection autofocus concept described herein uses the position of fringes imaged to a detector via glancing reflection off the substrate. The amount the fringes shift, $\Delta x$, for a given substrate height change, $\Delta z$, depends on the average angle of incidence of the two beams, $<\Theta>$, used to generate the fringes. The following fringe shift approximation is exact when the wavevectors are in the x-z plane and the substrate is parallel to the x-y plane.

$$\text{fringe shift} = \Delta x \approx 2\Delta z \tan(<\Theta>) \tag{11}$$

The ratio of fringe shift to substrate height change is what we call the "fringe shift sensitivity", and in this case it is simply $2*\tan(<\Theta>)$.

One potential issue with this approach is that the fringe phase repeats periodically as the substrate moves in z, so that the fringe phase can only be defined modulo $2\pi$. As a result there is an ambiguity in the substrate height of, $$\text{ambiguous substrate height} \approx \frac{\Lambda_x}{2\tan(\langle\theta\rangle)} \tag{12}$$

where $\Lambda_x$ is the fringe period on the substrate in the x-direction.

This aspect of the present invention deals with this potential issue using information already available in the basic autofocus system and method concept without creating more measurement information.

Derivation of Fringe Shift Sensitivity—$\psi$

This aspect of the present invention exploits a natural variation in fringe shift sensitivity among several measurement channels, which may exist simultaneously in a single fringe projection AF system. Applicants call this variation in fringe shift sensitivity, "fringe shift diversity".

As an example of a multi-channel fringe projection AF system, each channel could use a single wavelength, or wavelength band, and each band is sensed by a different detector or set of detector elements on the CCD detector 102a. In this case the various channels could be combined and separated with dichroic beam splitters, for example. However, the methods of implementing a multichannel fringe projection system are numerous and are not the subject of this invention.

To properly describe the source of the difference in the fringe shift diversity, it is advantageous to frame the situation in the space of the substrate—as if the fringe generator and substrate are conjugate via a 1:1 imaging system. To that end, assume that a single wavelength plane wave is incident on a linear reflective grating which reflects 0, +1, and −1 orders. The 0 order will be removed by a spatial filter in the imaging optics, and the +1 and −1 orders will be used to generate the 2-beam interference fringes that are reflected from the substrate and relayed to a detector, with is also, for our purposes here, at a 1:1 conjugate.

We'll assume that the optical axis of the imaging optics is contained in the x-z plane and makes an angle of $\Theta$ with the surface normal of the substrate. The direction of the 0-order beam has direction cosines of $\{\alpha_i, \beta_i, \gamma_i\}$ in the coordinates of the optical axis of the imaging optics, and $\{\alpha_0, \beta_0, \gamma_0\}$ in the coordinates of the substrate/grating/detector. The two coordinates are related by a simple rotation of $\Theta$ about the y-axis.

$$\alpha_0 = \alpha_i \cos\theta + \gamma_i \sin\theta$$

$$\beta_0 = \beta_i$$

$$\gamma_0 = -\alpha_i \sin\theta + \gamma_i \cos\theta \tag{13}$$

The directions of the +1 and −1 order are given by the grating equation and can be expressed in terms of the wavelength, $\lambda$, the fringe frequency vector $\{f_x, f_y\}$ (which is twice the grating frequency, but in the same direction) and the 0-order direction cosines as, $$\alpha_{\pm 1} = \alpha_0 \pm \tfrac{1}{2}\lambda \cdot f_x$$

$$\beta_{\pm 1} = \beta_0 \pm \tfrac{1}{2}\lambda \cdot f_y$$

$$\gamma_{\pm 1} = \sqrt{1 - \alpha_{\pm 1}^2 - \beta_{\pm 1}^2} \tag{14}$$

The phase of the interference fringes produced by the +1 and −1 orders on the substrate is given by, $$\phi_w = \frac{2\pi}{\lambda}[(\alpha_{+1} - \alpha_{-1})x + (\beta_{+1} - \beta_{-1})y + (\gamma_{+1} - \gamma_{-1})z] \tag{15}$$

The change of fringe phase with respect to z can be obtained by differentiation. However, because the substrate is used in reflection on the way to the detector, the change in phase with respect to z at the detector is twice that on the substrate.

$$\frac{\Delta\phi_d}{\Delta z} = \frac{4\pi}{\lambda}(\gamma_{+1} - \gamma_{-1}) = \frac{4\pi}{\lambda}\Delta\gamma \tag{16}$$

The fringe shift sensitivity (in the x-direction), $\psi$, is $$\psi = \frac{\Delta x}{\Delta z} \tag{17}$$

$$= \frac{1}{2\pi f_x} \cdot \frac{\Delta\phi_d}{\Delta z}$$

$$= \frac{2\Delta\gamma}{\lambda f_x}$$

$$= \frac{2}{\lambda f_x}\left[\sqrt{1 - \alpha_{+1}^2 - \beta_{+1}^2} - \sqrt{1 - \alpha_{-1}^2 - \beta_{-1}^2}\right]$$

$$= \frac{2}{\lambda f_x}\left[\sqrt{1 - \left(\alpha_0 + \frac{\lambda f_x}{2}\right)^2 - \left(\beta_0 + \frac{\lambda f_y}{2}\right)^2} - \sqrt{1 - \left(\alpha_0 - \frac{\lambda f_x}{2}\right)^2 - \left(\beta_0 - \frac{\lambda f_y}{2}\right)^2}\right]$$

$$\psi = \frac{2}{\lambda f_x}\left[\sqrt{\gamma_0^2 - \lambda(\alpha_0 f_x + \beta_0 f_y) - \frac{\lambda^2}{4}(f_x^2 + f_y^2)} - \sqrt{\gamma_0^2 + \lambda(\alpha_0 f_x + \beta_0 f_y) - \frac{\lambda^2}{4}(f_x^2 + f_y^2)}\right]$$

If we express the fringe vector in terms of the absolute fringe frequency and its angle from the x-axis the fringe shift sensitivity $\psi$ becomes $$\psi[\lambda, \alpha_0, \beta_0, \gamma_0] = \frac{\Delta x}{\Delta z} \tag{18}$$

-continued $$= \frac{2}{\lambda f \cos\delta} \left[ \sqrt{\gamma_0^2 - \lambda f(\alpha_0 \cos\delta + \beta_0 \sin\delta) - \frac{\lambda^2 f^2}{4}} - \sqrt{\gamma_0^2 + \lambda(\alpha_0 \cos\delta + \beta_0 \sin\delta) - \frac{\lambda^2 f^2}{4}} \right]$$

Typically, the first and second terms within the square root are of the same order of magnitude, while the final term, quadratic in wavelength is typically several orders of magnitude smaller.

From equation (18) we can see that the fringe sensitivity depends on the angle of the 0-order beam, which can be thought of as the angle of illumination, the wavelength, and the fringe vector. Note that the middle term in the square root determines the interaction of the y-direction cosine of the angle of illumination and the rotation of the fringes. This term gives us an additional degree of freedom in determining the fringe shift sensitivity.

Using Fringe Shift Diversity

If ψ did not vary with wavelength or direction of illumination, then all of the measurement channels would have the same sensitivity. However, because of equation (18) each one is different and we can use this to determine the absolute z-position since the difference between the fringe shifts is also a function of substrate height, but does not repeat for a much larger range of z. In fact the ambiguous range between measurement channels a and b is given by, $$\text{revised ambiguous range} = [(\psi[\lambda_b, \alpha_b, \beta_b, \gamma_b] - \psi[\lambda_a, \alpha_a, \beta_a, \gamma_a])/f_x]^{-1} \tag{19}$$

This can translate into several times the unambiguous range of a single channel. In a current design, using the two extreme wavelengths, the unambiguous range is actually 101 um with fringe shift diversity, and 15.5 um without. Using the nearest two, it becomes almost 300 um. Using a combination of several channels can extend the unambiguous range, practically, indefinitely.

The unambiguous height, within the range (19), can be determined by, $$\Delta z = \frac{\Delta x_{ab}}{\psi[\lambda_b, \alpha_b, \beta_b, \gamma_b] - \psi[\lambda_a, \alpha_a, \beta_a, \gamma_a]} \tag{20}$$

Where $\Delta x_{ab}$ is the difference in fringe positions between channels a and b.

From the foregoing, it will be apparent to those in the art that this aspect of the present invention overcomes one of the basic possible issues with fringe projection based autofocus—the ambiguity in measured substrate height that results from the periodic fringe pattern and its depth of focus. It is an important aspect a fringe projection AF system.

Compensating Abbe Errors in Embodiments of the Invention

Just like a distance measuring interferometer, a projection based AF system will experience errors induced by the tilt of the mirror surface (or substrate in the case of the AF system) under investigation.

As an example, take a substrate that is shifted 30 um in z, and tilted about the x-axis 200 urad. If the projected beam is incident on the substrate 86 degrees from normal, the AF error will be about 86 nm—definitely large enough to need compensation.

This aspect of the invention enables the correction of this error via an approximation of the substrate tilt through the numerically evaluated gradient of the fringe phase in a fringe projection AF system.

We present here an expression for the induced fringe phase ΔΦ—the fringe phase at the detector Φ minus the carrier phase. The carrier phase is a known quantity based on the illumination conditions, specifically involving Δk, the difference between the two wave-vectors that produce the two beam interference pattern. It also depends on the substrate normal vector n-hat, the position on the detector r-sub-d and an arbitrary point on the substrate $r_w$.

$$\Delta\Phi = \Phi - \Delta \vec{k} \cdot \vec{r}_d = 2(\hat{n} \cdot \Delta \vec{k})(\hat{n} \cdot (\vec{r}_w - \vec{r}_d)) \tag{21}$$

The above expression is not used directly in the algorithm, but is included here to describe what is actually measured by the fringe projection system, and how it is affected by substrate tilt.

The next set of expressions provide a way of estimating the substrate normal in terms of the derivatives of the phase in the x and y-directions, which can be evaluated numerically from the phase data normally gathered in a fringe projection system.

$$\hat{n}_1 \approx \frac{\left\{ -\frac{\partial}{\partial x_d} \Delta\Phi, -\frac{\partial}{\partial y_d} \Delta\Phi, 2\Delta k_z \right\}}{\sqrt{\left(\frac{\partial}{\partial x_d} \Delta\Phi\right)^2 + \left(\frac{\partial}{\partial y_d} \Delta\Phi\right)^2 + 4\Delta k_z^2}}, \hat{n}_2 \approx \frac{\left\{ -\frac{\partial}{\partial x_d} \Delta\Phi, -\frac{\partial}{\partial y_d} \Delta\Phi, 2(\hat{n}_1 \cdot \Delta \vec{k})n_{1z} \right\}}{\sqrt{\left(\frac{\partial}{\partial x_d} \Delta\Phi\right)^2 + \left(\frac{\partial}{\partial y_d} \Delta\Phi\right)^2 + 4(\hat{n}_1 \cdot \Delta \vec{k})^2}} \tag{22}$$

Note that the first estimate of the substrate normal, $\hat{n}_1$, depends only on the z-component of the difference in wave vectors, $\Delta k_z$, while the second estimate depends on the full difference in wave vectors dotted with the prior estimate. This refinement can be carried on to obtain greater accuracy, but in practice runs into machine precision problems after about 3 iterations. In practice it may not be necessary to go beyond the first estimate since, in simulation, it gave an estimated substrate normal 21 nrad from the exact direction of 200 urad from the z-axis.

The third critical expression is for the substrate position $r_w$, as shifted from the measurement point on the detector $r_d$, in terms of the substrate normal, which is estimated using the previous expression.

$$\vec{r}_w - \vec{r}_d = -\frac{\Delta\Phi}{(\hat{n} \cdot \vec{k})(\hat{n} \cdot \Delta \vec{k})}(\vec{k} - 2(\hat{n} \cdot \vec{k})\hat{n}) \tag{23}$$

Note that this expression uses a value, k, which is the average wave-vector between the two wave-vectors used to produce the two beam interference. This represents the second approximation, because it is used to estimate the position on the substrate that produces the phase measured at the detector point $r_d$.

Thus, the foregoing detailed description provides a basic autofocus system and method, using fringe projection, and also provides several important features of such an AF system and method. As will be appreciated by those in the art, the various features of the system and method of the present invention may be provided individually in an AF system and method, and in some instances some of the features can be combined. With the foregoing disclosure in mind, various ways in which an AF system and method can be designed and practiced, using fringe projection, in accordance with the principles of the present invention will be apparent to those in the art.

What is claimed is:

1. An autofocus system for use with a lithography exposure tool configured to expose a target substrate, said autofocus system comprising:
   a fringe projection system configured to project, at respectively corresponding multiple wavelengths, sinusoidal fringe patterns from a diffraction grating disposed inside the fringe projection system through a first optical element onto a surface of the target substrate, to form target sinusoidal fringe patterns thereon,
      said fringe projection system configured to deliver, to the target substrate, only light in +1 and −1 diffraction orders formed by said diffraction grating from light incident thereon;
   a fringe detection system having sensing elements positioned
      to acquire optical images of respectively corresponding target sinusoidal fringe patterns through a second optical element and an optical polarization-filtering element, and,
      to generate corresponding outputs respectively representing said images,
         wherein said optical images are formed at different wavelengths and different polarization states;
   a data processing system in operable communication with the sensing element and configured
      (i) to generate data based on the output, the data indicative of topology features on the surface of the target substrate as the substrate is moved relative to said target sinusoidal fringe patterns;
      (ii) to generate processed data to determine a topology profile of the surface of the target substrate in the vicinity of said target sinusoidal fringe patterns as the substrate is moved relative to the target sinusoidal fringe patterns.

2. An autofocus system according to claim 1, further comprising a fringe relay system configured to form said optical image of said target sinusoidal fringe pattern.

3. An autofocus system according to claim 1, wherein said fringe relay system includes at least one of i) a spectral filter unit configured to form multiple optical images of said target sinusoidal fringe pattern on said fringe detection system, and ii) a polarization filter unit configured to form multiple optical images of said sinusoidal fringe pattern on said fringe detection system.

4. An autofocus system according to claim 1, wherein the autofocus system is configured to define temporal phase shifting to said optical images without using any moving parts in said autofocus system.

5. An autofocus system according to claim 1, structured to cause said temporal phase shifting by synchronizing a rate of acquisition of optical data at the sensing element with a shift of said optical images across the sensing element by integer pre-determined number of pixels.

6. An autofocus system according to claim 1, wherein diffraction grating is oriented such that fringes in the projected sinusoidal fringe pattern are inclined with respect to a direction of target substrate scanning in the lithography exposure tool.

7. An autofocus system according to claim 1, wherein the data processing system is configured to correct said topology profile for
   geometric errors caused by a tilt of the target substrate and for pattern-induced errors outside a pre-determined spatial frequency range; and
   Goos-Hanchen errors associated with reflectance of light from the target substrate.

8. A surface position detecting system for use with a lithography exposure tool configured to expose a target substrate, said surface position detecting system comprising:
   a fringe projection system configured to project a sinusoidal fringe pattern from a source of said sinusoidal fringe pattern disposed inside the fringe projection system through a first optical element onto a surface of the target substrate to be exposed by the lithography exposure tool, to form a target sinusoidal fringe pattern thereon;
   a fringe detection system having a sensing element positioned to acquire an optical image of said target sinusoidal fringe pattern, formed at said sensing element through a second optical element, and to generate an output representing said image;
   a data processing system in operable communication with the sensing element and configured to generate data based on the output, the data indicative of topology features on the surface of the target substrate as the substrate is moved relative to said target sinusoidal fringe pattern;
   an optical polarization-filtering element disposed before the fringe detection system and configured to form multiple optical images of the target sinusoidal fringe pattern at fringe detection system;
   wherein the surface position detecting system is configured to define temporal phase shifting in the optical image without using any moving parts in the surface position detecting system,
   wherein the data processing system is configured to correct the topology profile for Goos-Hanchen errors associated with reflectance of light from the target surface.

9. An autofocus system for use with a lithography exposure tool configured to expose a target substrate, said autofocus system comprising:
   a fringe projection system configured to project a sinusoidal fringe pattern from a source of said sinusoidal fringe pattern disposed inside the fringe projection system onto a surface of the target substrate to be exposed by the lithography exposure tool, to form a target sinusoidal fringe pattern thereon;
   a fringe detection system having a sensing element positioned to acquire an optical image of said target sinusoidal fringe pattern and to generate an output representing said optical image;
   a data processing system that is in operable communication with the sensing element and configured to:
      (i) generate data based on the output, the data indicative of topology features on the surface of the target substrate in the vicinity of said target sinusoidal fringe pattern as the substrate is moved relative to the target sinusoidal fringe pattern, and
      (ii) generate processed data to determine a topology profile of the surface of the target substrate as the substrate is moved relative to the target sinusoidal fringe pattern; and
   a first optical element,
      wherein said source includes a diffraction grating, and wherein the fringe projection system is configured to project, through the first optical element, only +1 and −1 diffraction orders formed by said diffraction grating from light incident thereon.

10. An autofocus method according to claim 9, wherein said autofocus system is configured to define temporal phase shifting in said optical image without the use of a moving element in said autofocus system.

11. An autofocus system according to claim 10, structured to cause said temporal phase shifting by synchronizing a rate of acquisition of optical data at the sensing element with a movement of the target substrate relative to said target sinusoidal fringe pattern.

12. An autofocus system according to claim 10, wherein the fringe detection system is configured to detect said image at a predetermined set of phase differences from the same region of the target substrate to a region on the sensing element, which region on the sensing element changes as the target substrate moves relative to the target sinusoidal fringe pattern.

13. An autofocus system according to claim 9, wherein the diffraction grating is oriented such that fringes in said target sinusoidal fringe pattern are inclined with respect to a direction of target substrate scanning in the lithography exposure tool.

14. An autofocus system according to claim 9, wherein the diffraction grating is oriented to define a pre-determined phase difference between a first phase of light incident onto a first row of pixels of the sensing element and a second phase of light incident onto a second row of pixels of the sensing element, said first and second rows being neighboring rows, said phase difference being independent from a velocity of the target substrate.

15. An autofocus system according to claim 14, wherein the data processing system is configured to generate said processed data with the use of five or more phase difference values that differ from one another by $\pi/2$ to reduce errors, of said topology profile, caused by variation of reflectance of light from the target substrate.

16. An autofocus system according to claim 14, wherein the fringe detection system is configured to acquire an optical image of a region of interest of the target sinusoidal pattern at times when said optical image is shifted, across the sensing element, by an integer number of pixels.

17. An autofocus system according to claim 9, further comprising multiple non-monochromatic sources of light and structured to project multiple sinusoidal fringe patterns onto the surface of the target substrate at wavelengths respectively corresponding to said multiple sources of light to determine a topology profile on said wavelengths.

18. An autofocus system according to claim 9, wherein the data processing system is configured to correct said topology profile for geometric errors caused by a tilt of the target substrate.

19. An autofocus system according to claim 9, wherein the data processing system is configured to correct said topology profile for Goos-Hanchen errors associated with reflectance of light from the target substrate.

20. An autofocus system according to claim 9, wherein a surface of the sensing element and the surface of the target substrate are optically conjugate via an optical system disposed between the target substrate and the sensing element.

21. An autofocus system according to claim 9, further comprising a fringe relay system configured to farm said optical image of said target sinusoidal fringe pattern.

22. An autofocus system for use with a lithography exposure tool configured to expose a target substrate, said autofocus system comprising:
  a fringe projection system configured to project a sinusoidal fringe pattern from a source of said sinusoidal fringe pattern disposed inside the fringe projection system through a first optical element onto a surface of the target substrate to be exposed by the lithography exposure tool, to form a target sinusoidal fringe pattern thereon;
  a fringe detection system haying a sensing element positioned to acquire an optical image of said target sinusoidal fringe pattern, formed at said sensing element through a second optical element, and to generate an output representing said image;
  a data processing system in operable communication with the sensing element and configured
    to generate data based on the output, the data indicative of topology features on the surface of the target substrate as the substrate is moved relative to said target sinusoidal fringe pattern;
  wherein the autofocus system is configured to define temporal phase shifting in said optical image without using any moving parts in said autofocus system,
  wherein the source includes a diffraction grating, and
  wherein the autofocus system is configured to project, through the first optical element, only +1 and −1 diffraction orders formed by said diffraction grating from light incident thereon.

23. An autofocus system according to claim 22, wherein the data processing system is further configured to generate processed data to determine a topology profile of the surface of the target substrate in the vicinity of said target sinusoidal fringe pattern as the substrate is moved relative to the target sinusoidal fringe pattern.

24. An autofocus system according to claim 22, wherein the data processing system is configured to correct said topology profile for geometric errors caused by a tilt of the target substrate and for pattern-induced errors outside a pre-determined spatial frequency range.

25. An autofocus system according to claim 22, wherein the diffraction grating is oriented such that fringes in said target sinusoidal fringe pattern are inclined with respect to a direction defined by a process of substrate scanning in the lithography exposure tool.

26. An autofocus system according to claim 22, further comprising a second optical element disposed between the target substrate and the fringe detection system such that the diffraction grating, the target substrate, and the sensing element are optically conjugate of one another via at least one of the first and second optical elements.

27. An autofocus system according to claim 22, structured to cause said temporal phase shifting by synchronizing a rate of acquisition of optical data at the sensing element with a shift of said optical image across the sensing element by an pre-determined number of pixels.

28. An autofocus system according to claim 22, further comprising a fringe relay system in optical communication with the target substrate and the fringe detection system and configured to form said optical image of said target sinusoidal fringe pattern.

* * * * *